(12) United States Patent
Nikaido

(10) Patent No.: US 8,589,108 B2
(45) Date of Patent: Nov. 19, 2013

(54) SEMICONDUCTOR DEVICE FAILURE ANALYSIS METHOD AND APPARATUS AND PROGRAM

(75) Inventor: Masafumi Nikaido, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 413 days.

(21) Appl. No.: 12/923,485

(22) Filed: Sep. 23, 2010

(65) Prior Publication Data
US 2011/0077877 A1 Mar. 31, 2011

(30) Foreign Application Priority Data
Sep. 25, 2009 (JP) ................................. 2009-220385

(51) Int. Cl.
*G01R 3/00* (2006.01)
*G06F 3/00* (2006.01)
*G06F 3/01* (2006.01)
*G06F 3/023* (2006.01)

(52) U.S. Cl.
USPC ............ 702/117; 702/179; 702/182; 702/183

(58) Field of Classification Search
USPC ............ 702/40, 58, 117, 155, 179, 182, 183; 40/361; 716/50; 850/9
See application file for complete search history.

(56) References Cited

U.S. PATENT DOCUMENTS

| 5,502,306 | A | 3/1996 | Meisburger et al. |
| 5,821,761 | A | 10/1998 | Shida et al. |
| 6,269,565 | B1 * | 8/2001 | Inbar et al. ...................... 40/361 |
| 6,539,106 | B1 | 3/2003 | Gallarda et al. |
| 6,855,929 | B2 * | 2/2005 | Kimba et al. ...................... 850/9 |
| 7,559,047 | B2 * | 7/2009 | Miyamoto et al. .............. 716/50 |
| 7,786,436 | B1 | 8/2010 | Lundquist et al. |

FOREIGN PATENT DOCUMENTS

| DE | 195 26 194 A1 | 2/1996 |
| DE | 100 00 364 A1 | 7/2000 |
| JP | 5-258703 A | 10/1993 |
| JP | 2007-155449 A | 6/2007 |

OTHER PUBLICATIONS

Extended European Search Report dated Sep. 22, 2011.

* cited by examiner

*Primary Examiner* — Marc Armand
*Assistant Examiner* — Felix Suarez
(74) *Attorney, Agent, or Firm* — McGinn IP Law Group, PLLC

(57) ABSTRACT

A semiconductor device failure analysis method and apparatus and a computer program for the method and apparatus are provided. The method includes: an observation image acquisition process of acquiring a voltage contrast image by charging an exposed conductive layer of a semiconductor device and irradiating the exposed conductive layer with charged particles; a wiring search process of searching for end points connected to the conductive layer based on design data; and a determination process of comparing voltage contrasts of three levels or more set in advance, one of which is set for a wiring depending on a state of an end point of the wiring, with the voltage contrast image acquired in the observation image acquisition process to determine consistency/inconsistency. Since three or more levels are set, for example, a short-circuit formed by a conductive layer connected to a transistor diffusion layer and another wiring can be identified.

20 Claims, 22 Drawing Sheets

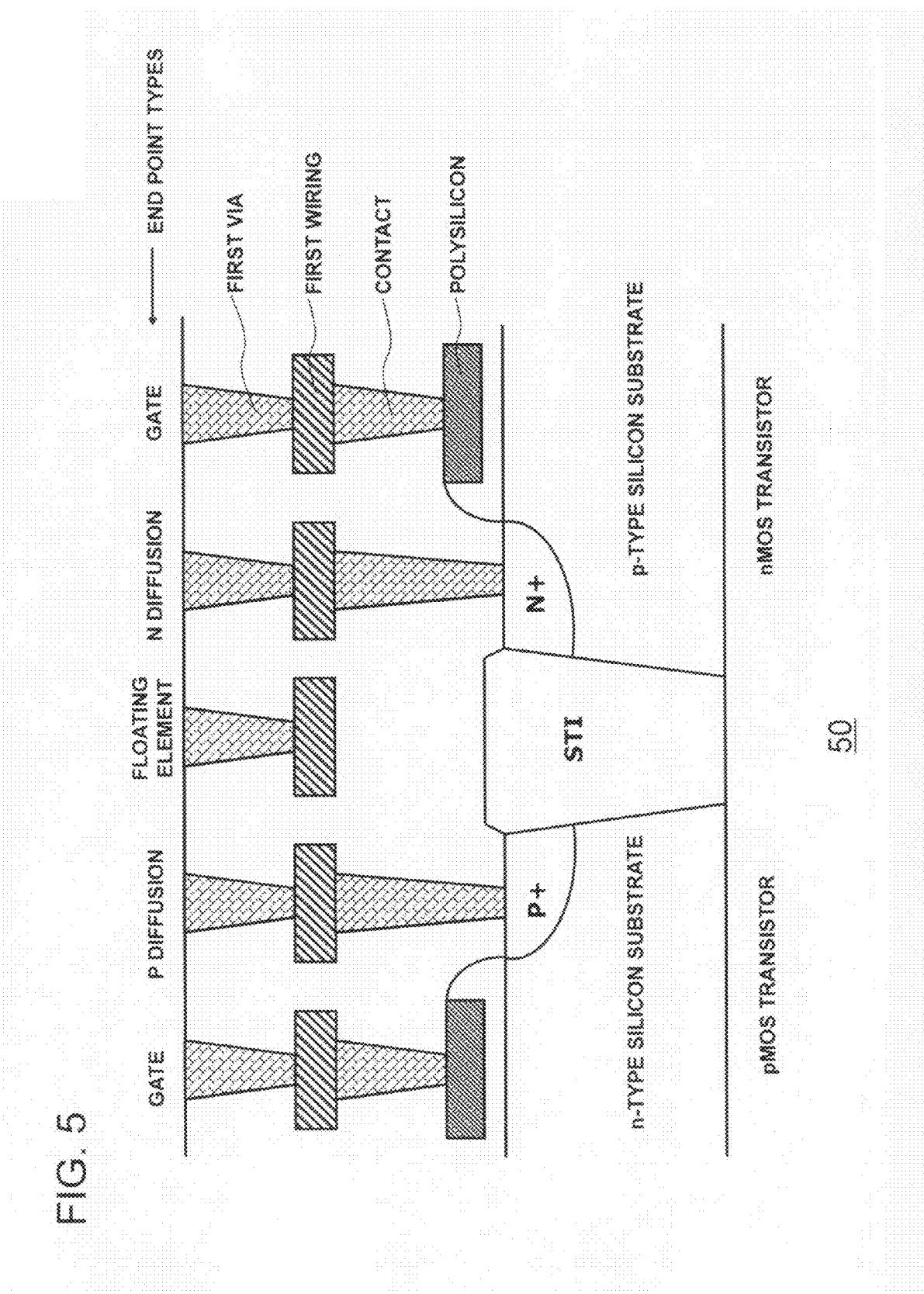

FIG. 9A
| # THRESHOLD TYPES, | THRESHOLDS: |
|---|---|
| T1, | 64 ; |
| T2, | 128 ; |
| T3, | 192 ; |
FIG. 9B
| # BRIGHTNESS LEVELS, | BRIGHTNESS |
|---|---|
| B1, | 0~63 |
| B2, | 64~127 |
| B3, | 128~191 |
| B4, | 192~255 |
FIG. 9C
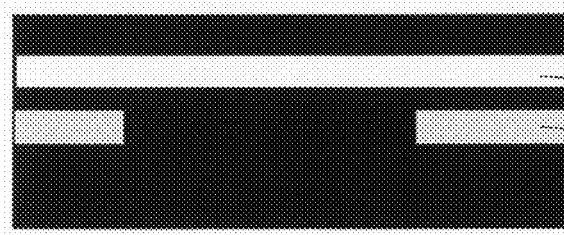
BRIGHTNESS RANGES : B4
BRIGHTNESS RANGES : B2
BRIGHTNESS RANGES : B1
FIG. 9D
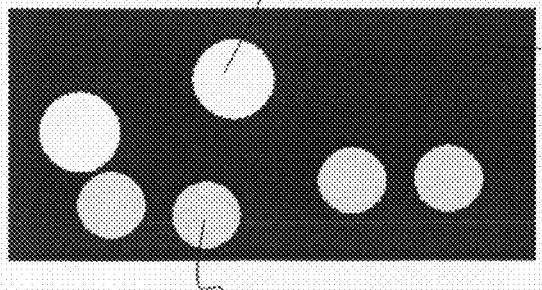
BRIGHTNESS RANGES : B4
BRIGHTNESS RANGES : B1
BRIGHTNESS RANGES : B2

FIG. 10A
| # BRIGHTNESS LEVELS, | END POINTS |
|---|---|
| B2 | GATE |
| B4 | P DIFFUSION |
| B3 | N DIFFUSION |
| B4 | GATE , P DIFFUSION |
| B3 | GATE , N DIFFUSION |
| B4 | P DIFFUSION, N DIFFUSION |
| B4 | GATE , P DIFFUSION , N DIFFUSION |
| B1 | FLOATING |
| B0 | BACKGROUND |
FIG. 10B
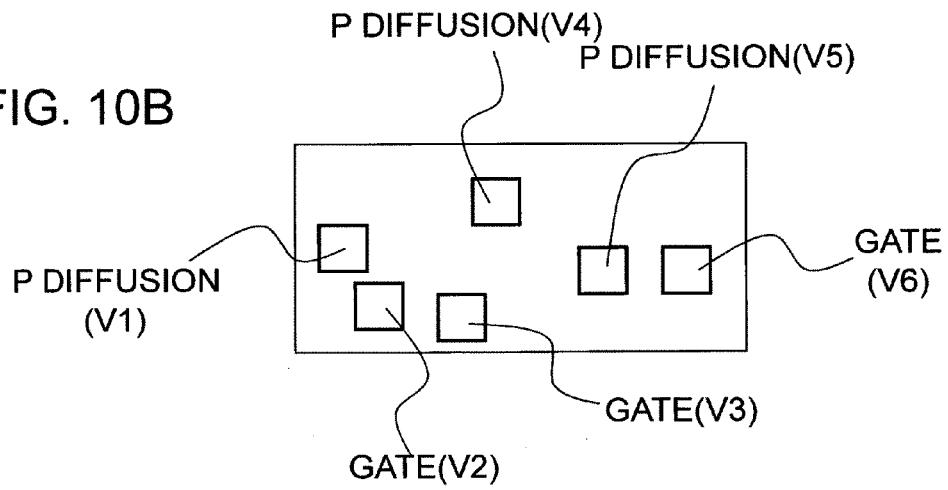
FIG. 10C
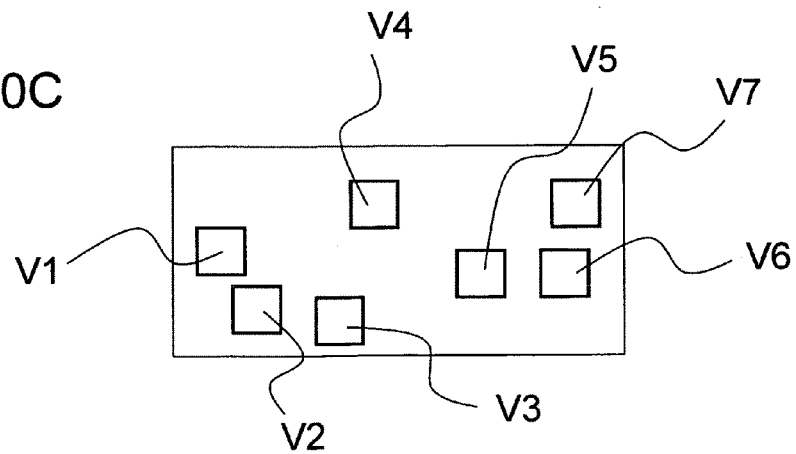

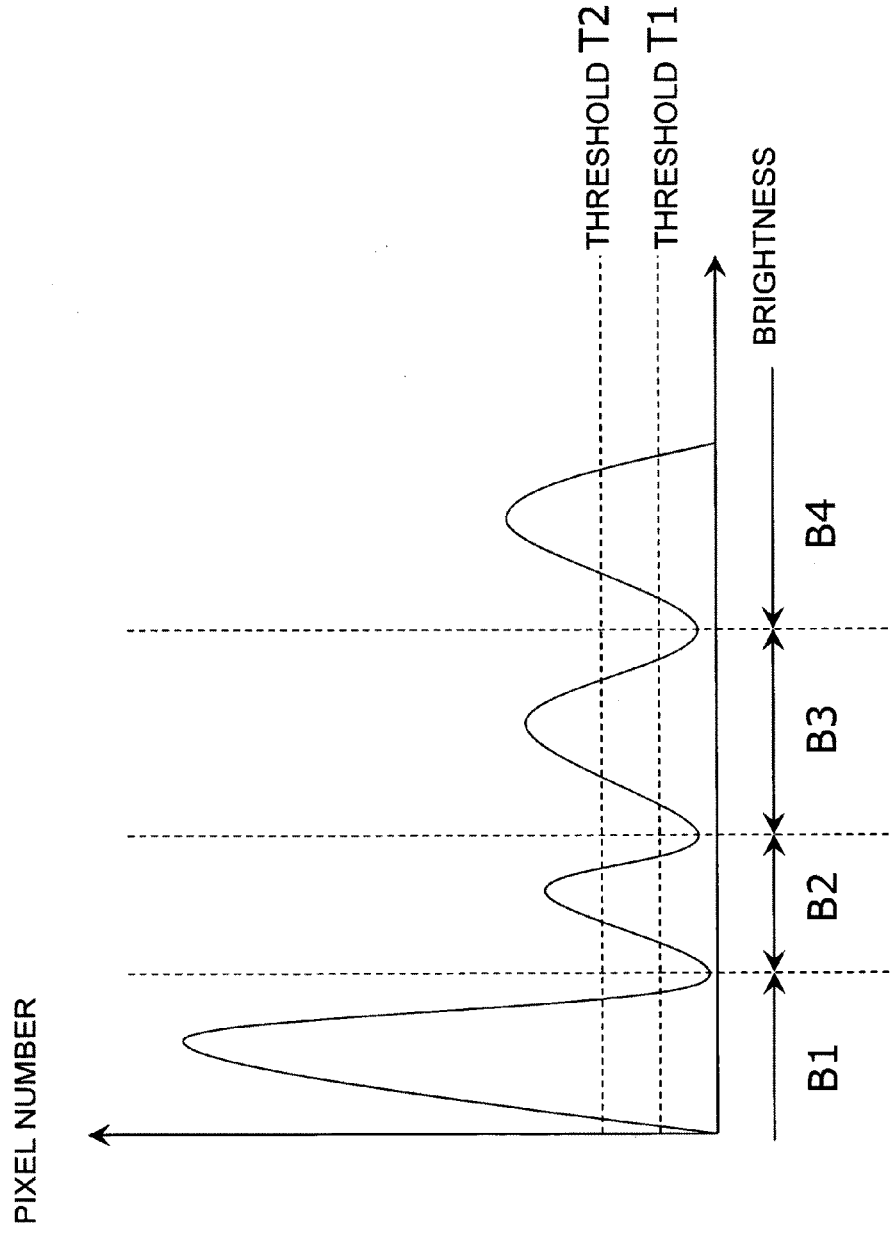

SEMICONDUCTOR DEVICE FAILURE ANALYSIS METHOD AND APPARATUS AND PROGRAM

REFERENCE TO RELATED APPLICATION

This application is based upon and claims the benefit of the priority of Japanese patent application No. 2009-220385, filed on Sep. 25, 2009, the disclosure of which is incorporated herein in its entirety by reference thereto.

TECHNICAL FIELD

The present invention relates to a semiconductor device failure analysis method and apparatus and to a program for the method and apparatus. In particular, it relates to: a method and an apparatus for analyzing defects of a semiconductor device by charging a conductive layer of the semiconductor device, irradiating the conductive layer with charged particles, and acquiring a voltage contrast image in a non-contact manner; and a computer program for the method and apparatus.

BACKGROUND

As the integration and performance of semiconductor devices advance, analysis of defects of the semiconductor devices is increasingly becoming difficult. In response, to facilitate the analysis of defects of semiconductor devices as much as possible, various techniques for analyzing defects of semiconductor devices have been developed. According to one method for analyzing defects of semiconductor devices, an electron beam inspection apparatus is used to acquire a voltage contrast image and identify defect positions.

According to this method, first, a semiconductor device is polished by polishing or the like, so that a surface of a conductive layer (wirings or vias) to be observed is exposed. Next, the surface of the semiconductor device is charged to a desired voltage, and the exposed conductive layer is next irradiated with charged particles by an electronic beam. Secondary electrons are released from the semiconductor device, and a voltage contrast image formed thereby is observed by a scanning electron microscope (SEM). If a disconnection defect or a short-circuit defect is present in a lower layer of the conductive layer to be observed, the obtained voltage contrast image is different from that obtained from a normal semiconductor device. Thus, by acquiring voltage contrast images of defective and good semiconductor devices and comparing the images with each other, inconsistent positions are detected.

For example, Patent Document 1 discloses an automatic inspection system for an x-ray mask and the like. According to this document, by irradiating a conductive substrate with charged particles by an electron beam, detecting any of the generated secondary electrons, reflection electrons, and transmission electrons, and comparing an image formed by the detected signals with an image used as a reference, defects are automatically detected.

In addition, Patent Document 2 proposes a failure analysis apparatus as an improvement of a conventional technique. According to Patent Document 2, defects are analyzed by using an absorption electric potential method. Based on this method, first, a surface of a wiring or via to be observed is exposed by polishing, and the exposed surface is irradiated with charged particles by an electron beam. Whether a current leaks from the wiring to be analyzed to a substrate of a semiconductor integrated circuit device is displayed as a voltage contrast image. The voltage contrast image obtained by the absorption electric potential method is compared with an expectation image generated by pattern design data. When an end point of the wiring to be analyzed is a layer connected to a drain region of a metal oxide semiconductor (MOS) transistor, a low contrast is obtained by the absorption electric potential method. On the other hand, when the end point is a layer connected to a gate electrode of a MOS transistor, a high contrast is obtained (paragraphs 0015, 0026, and 0027 of Patent Document 2). When an end point of the wiring to be analyzed is a drain region of a MOS transistor, if a disconnection defect is present in the wiring, a high contrast is obtained. In this way, a disconnection defect can be detected (paragraphs 0032 to 0044 of Patent Document 2). When an end point of the wiring to be analyzed is a gate electrode of a MOS transistor, if a short-circuit defect is present in the wiring and the short-circuit defect causes a leakage current path between the wiring and a semiconductor substrate, a low contrast is obtained. In this way, a short-circuit defect can be detected (paragraphs 0045 to 0047 of Patent Document 2). Thus, Patent Document 2 uses the voltage contrast image obtained by the absorption electric potential method and the expectation image generated by design data, to detect the presence of a current leakage. Namely, defects are detected based on binary data (high contrast or low contrast).

Patent Document 1: Japanese Patent Kokai Publication No. JP-A-5-258703, which corresponds to U.S. Pat. No. 5,502,306.
Patent Document 2: Japanese Patent Kokai Publication No. JP2007-155449A

SUMMARY

The above Patent Documents are incorporated herein by reference thereto. Analysis will be hereinafter made based on the present invention. Patent Document 1 uses an electron beam inspection apparatus and a voltage contrast method. According to the document, voltage contrast images of defective and non-defective semiconductor devices are acquired and compared with each other to detect inconsistent positions. Namely, this method requires a non-defective semiconductor device. If none of the semiconductor devices is manufactured as designed and only the defective products are available or if an operation defect is present due to some factor and no semiconductor devices can be used as a reference for comparison, defective positions cannot be identified.

Further, Patent Document 2 proposes the method in which a surface of a wiring or via to be observed is exposed by polishing and a voltage contrast image obtained by the absorption electric potential method is compared with an expectation image generated by pattern design data. However, when an end point of the wiring to be analyzed is a gate electrode of a MOS transistor, if a disconnection defect is present in the wiring, no current leakage is caused between the wiring and a semiconductor substrate. Thus, since a high contrast is obtained as in the case of a non-defective product, disconnection defects cannot be detected. Further, when an end point of the wiring to be analyzed is a drain region of a MOS transistor, if a short-circuit defect is present in the wiring, a low contrast is obtained as in the case of a non-defective product. Thus, short-circuit defects cannot be detected.

According to a first aspect of the present invention, there is provided a semiconductor device failure analysis method including: an observation image acquisition process of charging an exposed conductive layer of a semiconductor device and irradiating the conductive layer with charged particles to acquire an observation image of the conductive layer having a voltage contrast; a layout acquisition process of acquiring a layout pattern of the conductive layer on the observation image from design data about the semiconductor device; a wiring search process of searching for wiring end points connected to the layout pattern; and a brightness acquisition process of acquiring brightness levels of the observation image corresponding to the layout pattern searched for in the wiring search process. The method further includes: a brightness association process of creating in advance a table indicating a correspondence relationship between three or more brightness levels of an observation image and wiring end points connected to a layout pattern corresponding to the observation image to associate the brightness levels and wiring end points; a determination process of determining whether the observation image brightness levels acquired in the brightness acquisition process and the wiring end points searched for in the wiring search process are consistent with the table indicating a correspondence relationship between brightness levels and wiring end points associated in the brightness association process; and an output process of outputting results of the determination process. The brightness acquisition process includes: a figure detection process of executing an image process to extract edges in the observation image and detect figurative elements of the image; a multiple brightness level setting process of setting brightness thresholds and using the brightness thresholds as references to set three or more brightness levels and assign each pixel of the observation image with one of the brightness levels; a figure brightness detection process of detecting the brightness levels set in the multiple brightness level setting process and assigned to the individual pixels of each of the figurative elements detected in the figure detection process and determining a majority brightness level of each of the figurative elements to be the brightness level of the figurative element; and a figure brightness acquisition process of extracting figurative elements corresponding to the layout pattern from the figurative elements detected in the figure detection process and extracting brightness levels detected in the figure brightness detection process.

According to a second aspect of the present invention, there is provided a semiconductor device failure analysis apparatus including: an observation image acquisition unit that charges an exposed conductive layer of a semiconductor device to a desired voltage and irradiates the conductive layer with charged particles to acquire an observation image of the conductive layer having a voltage contrast; a layout acquisition unit that acquires a layout pattern of the conductive layer on the observation image from design data about the semiconductor device; a wiring search unit that searches for end points connected to the conductive layer based on the layout pattern of the conductive layer acquired by the layout acquisition unit; a brightness acquisition unit that acquires brightness levels of the observation image corresponding to the layout pattern searched for by the wiring search unit; a brightness association unit that creates in advance a table indicating a correspondence relationship between three or more brightness levels of an observation image and wiring end points connected to a layout pattern corresponding to the observation image to associate the brightness levels and wiring end points; a determination unit that determines whether the observation image brightness levels acquired by the brightness acquisition unit and the wiring end points searched for by the wiring search unit are consistent with the table indicating a correspondence relationship between brightness levels and wiring end points associated by the brightness association unit; an output unit that outputs information identifying positions determined to be inconsistent as a result of processing by the determination unit; and a display unit that displays information outputted by the output unit. The brightness acquisition unit includes: a figure detection unit that extracts edges in the observation image to detect figurative elements of the image; a multiple brightness level setting unit that sets brightness thresholds and uses the brightness thresholds as references to set three or more brightness levels and assign each pixel of the observation image with one of the brightness levels; a figure brightness detection unit that detectes the brightness levels set by the multiple brightness level setting unit and assigned to the individual pixels of each of the figurative elements detected by the figure detection unit to determine a majority brightness level of each of the figurative elements to be the brightness level of the figurative element; and a figure brightness acquisition unit that extracts figurative elements corresponding to the layout pattern from the figurative elements detected by the figure detection unit and extracts brightness levels detected by the figure brightness detection unit.

According to a third aspect of the present invention, there is provided a program that causes a computer to execute the semiconductor device failure analysis method of the first aspect. According to a fourth aspect of the present invention, there is provided a program that causes a computer to function as the semiconductor device failure analysis apparatus of the second aspect. The program may be stored on a computer readable medium.

The meritorious effects of the present invention are summarized as follows.

According to the present invention, when defects of a semiconductor device are analyzed and a non-defective semiconductor device as a reference is not available, by using a voltage contrast image of a single defective semiconductor device, defective positions can be identified. Further, since voltage contrasts of three levels or more are set and one of the contrasts is set for a wiring depending on a state of an end point connected to the wiring, a disconnection defect or a short-circuit defect that cannot be detected by the absorption electric potential method can be detected.

BRIEF DESCRIPTION OF THE DRAWINGS

FIG. 5 is a sectional view of a MOS semiconductor device used as a semiconductor device to be analyzed.

FIG. 9A illustrates brightness thresholds, FIG. 9B illustrates a range of each of the brightness levels, FIG. 9C illustrates an observation image including multiple brightness levels when the observation surface includes a wiring layer, and FIG. 9D illustrates an observation image including multiple brightness levels when the observation surface is a via layer.

FIG. 10A illustrates a table indicating a correspondence relationship between multiple brightness levels set in advance and wiring end points, FIG. 10B illustrates a via layer on an observation surface and end points connected to the via layer, and FIG. 10C illustrates a via layer on another observation surface.

FIG. 14 illustrates a multiple brightness level setting process based on brightness levels and a pixel number distribution for each of the brightness levels.

FIG. 17A illustrates an output example in which each of the wirings determined to be inconsistent is displayed in a different color, FIG. 17B illustrates an output example in which part of a wiring determined to be inconsistent and a connection point of the wiring are displayed in different colors, and FIG. 17C is an output example in which wirings included in a conductive layer and determined to be inconsistent are displayed in different colors on the observation surface.

FIG. 18A illustrates a display example in which a layout including wirings displayed in different colors depending on consistency or inconsistency is superposed on an observation image, FIG. 18B is a display example in which a layout including an inconsistent wiring is superposed on an observation image, and FIG. 18C is a display example in which a layout including wirings displayed in different colors depending on the end points thereof is superposed on an observation image.

PREFERRED MODES

Figure 1:
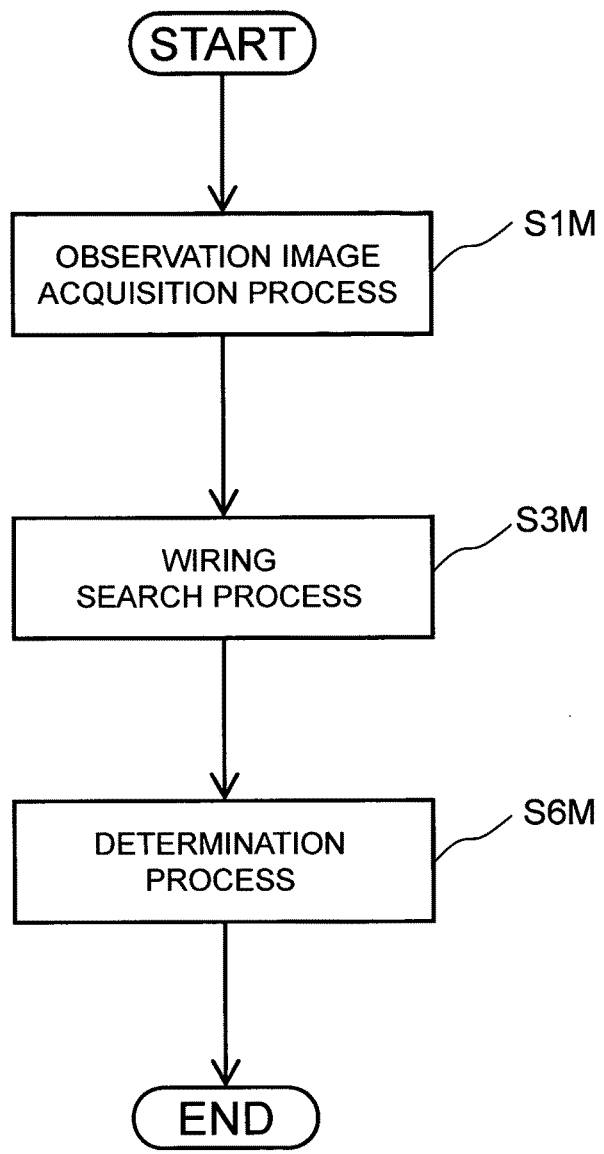
FIG. 1 is a flow chart illustrating general processes of a semiconductor device failure analysis method according to an example of the present invention.

First, outlines of exemplary embodiments of the present invention will be described. The drawings and reference characters referred to in the description of the outlines of the exemplary embodiments are used to illustrate, by way of examples, the exemplary embodiments. Therefore, variations of the exemplary embodiments according to the present invention are not limited by the drawings and reference characters.

Figure 6:
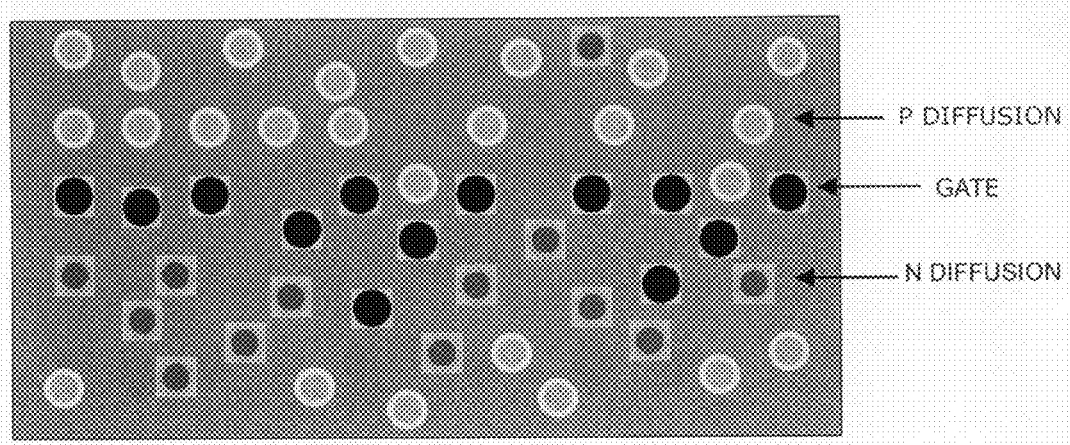
FIG. 6 illustrates a voltage contrast image of a MOS semiconductor device obtained in a positive voltage contrast (PVC) mode.

As illustrated in FIG. 1, a semiconductor device failure analysis method according to an exemplary embodiment of the present invention includes: an observation image acquisition process (step S1M) of acquiring a voltage contrast image by charging an exposed conductive layer of a semiconductor device and irradiating the exposed conductive layer with charged particles; a wiring search process (step S3M) of searching for end points connected to the conductive layer based on design data; and a determination process (step S6M) of comparing voltage contrasts of three levels or more set in advance, one of which is set for a wiring depending on a state of an end point of the wiring (see FIG. 6 illustrating a voltage contrast difference among the P diffusion, the N diffusion, and the gate and FIG. 10A illustrating a table indicating a correspondence relationship between brightness levels and wiring end portions, for example), with the voltage contrast image (FIGS. 4A and 4B, for example) acquired in the observation image acquisition process (step S1M) and determining consistency/inconsistency.

In the field of semiconductor device failure analysis apparatuses, generally, voltage contrasts are represented as brightness levels. However, other than brightness levels, the voltage contrasts may be represented as colors, three-dimensional heights, or the like.

According to the present invention, multiple voltage contrasts of three levels or more are set, and one of the voltage contrasts is set for a wiring, depending on a state of an end point connected to a conductive layer. According to the present invention, these voltage contrasts can be accurately determined. The end point refers to a conductive layer end connected to a via arranged in a direction perpendicular to a plain surface of a semiconductor or a wiring arranged in a direction in parallel to the plain surface of the semiconductor. Hereinafter, a wiring includes a via unless otherwise stated. The voltage contrasts differ depending on whether the end point is connected to an N-type semiconductor layer, to a P-type semiconductor layer, or to a gate electrode. If necessary, the voltage contrasts may differ depending on the number of connected semiconductor layers or gate electrodes or the area of a connected semiconductor layer or gate electrode. The state of an end point connected to the conductive layer can be automatically acquired from design data in the wiring search process (step S3M).

Based on the above configuration, it is possible to identify whether or not a wiring is properly connected to a gate electrode and whether or not a wiring (including a via) is disconnected, which cannot be detected by the absorption electric potential method disclosed in Patent Document 2. This is because, since the wiring shape and parasitic capacitance are different between a wiring properly connected to a gate electrode and a wiring disconnected from the gate electrode, when a wiring is charged, progress of charging differs.

It is also possible to identify whether or not a wiring (including a via) connected to a drain or a source of a MOS transistor is short-circuited with another wiring (including a via). This is because, when a wiring forms a short circuit, if the wiring is charged, progress of charging differs depending on whether the wiring is connected to an N-type semiconductor layer or to a P-type semiconductor layer. The progress of charging also differs depending on the shape, voltage, type, or area of a connected semiconductor layer. The progress of charging also differs depending on the number of connected semiconductor layers.

The semiconductor device failure analysis method may further include a layout acquisition process (step S2 in FIG. 2) of acquiring a layout pattern corresponding to the conductive layer on the observation image from semiconductor device design data. The wiring search process (step S3 in FIG. 2) may search for an end point of a wiring (including a via) connected to the layout pattern. In this way, since voltage contrasts can be determined based on information about the wiring end point searched for by using design data, a non-defective sample to be compared for failure analysis is not needed.

Figure 2:
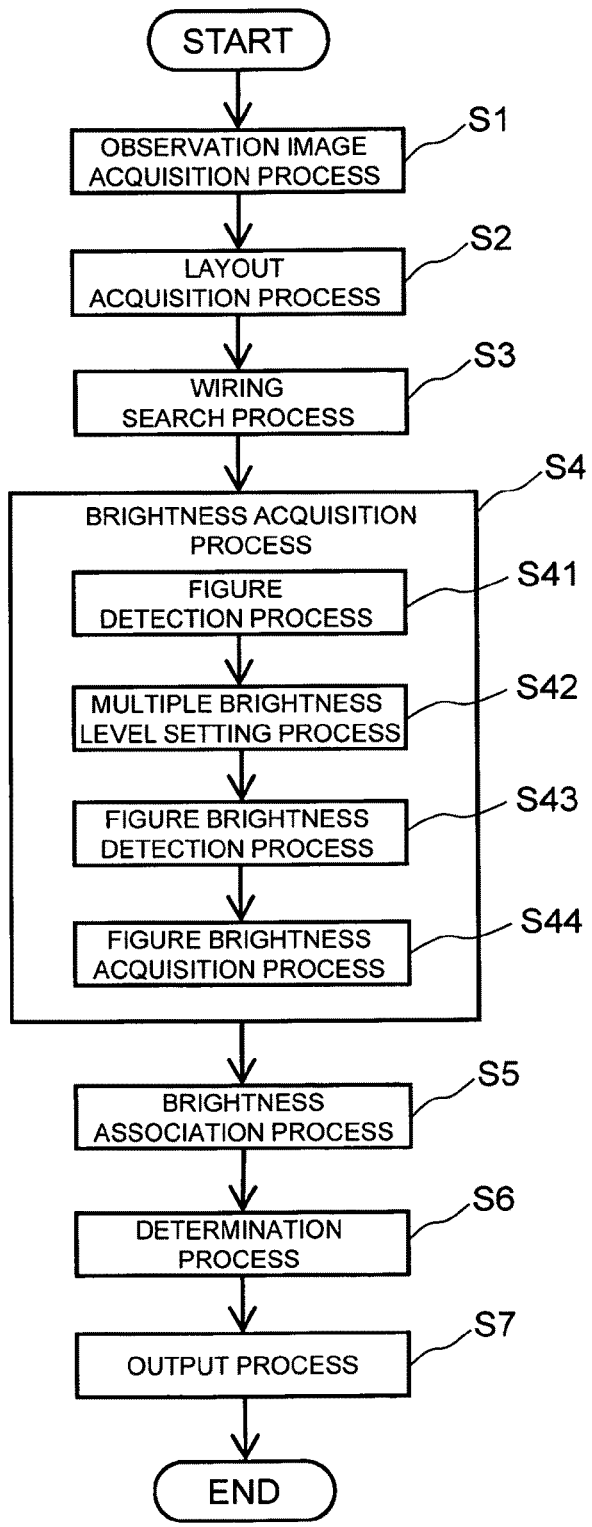
FIG. 2 is a flow chart illustrating detailed processes of the failure analysis method according to the example of the present invention.

In addition, as illustrated in FIG. 2, the semiconductor device failure analysis method further includes: a brightness acquisition process (step S4) of acquiring brightness levels of the observation image corresponding to the layout pattern searched for in the wiring search process; a brightness association process (step S5) of creating in advance a table indicating a correspondence relationship between multiple brightness levels and end points of wirings (including vias) to associate the brightness and the wiring end point; and an output process (step S7) of outputting results of the determination process (step S6). In the determination process (step S6), whether the observation image brightness levels acquired in the brightness acquisition process (step S4) are consistent with brightness levels corresponding to the wiring end points obtained in the brightness association process (step S5). The brightness acquisition process (step S4) may include: a figure detection process (step S41) of carrying out an image process to extract edges in an observation image and detect figurative elements in the image; a multiple brightness level setting process (step S42) of setting brightness thresholds and using the brightness thresholds as references to set multiple brightness levels and assign each pixel of the observation image with one of the brightness levels; a figure brightness detection process (step S43) of detecting the brightness levels set in the multiple brightness level setting process (step S42) and assigned to the individual pixels of each of the figurative elements detected in the figure detection process (step S41) and determining a majority brightness level of each of the figurative elements to be the brightness level of the figurative element; and a figure brightness acquisition process (step S44) of extracting figurative elements corresponding to the layout pattern from the figurative elements detected in the figure detection process (step S41) and extracting brightness levels detected in the figure brightness detection process (step S43).

According to the above procedure, voltage contrasts displayed as brightness levels can be determined.

Further, in the above multiple brightness level setting process (step S42), a pixel number distribution may be obtained for each brightness level to automatically calculate brightness thresholds, the number of brightness levels, and values of the individual brightness levels. In this way, even when the brightness levels of an observation image are changed as observation conditions or device characteristics change, multiple brightness levels can be set easily and automatically.

Further, in the figure brightness acquisition process (step S44), a pattern matching image process may be carried out on the figurative elements detected in the figure detection process (step S41) and the layout pattern to extract the figurative elements corresponding to the layout pattern and brightness levels detected in the figure brightness detection process (step S43). In this way, since the wiring pattern on the observation image and the layout pattern can be compared automatically, it is possible to automatically determine whether the brightness levels of the wiring pattern on the observation image correspond to values expected based on the end points of the layout pattern.

In the brightness association process (step S5), multiple observation image brightness levels set in the multiple brightness level setting process and wiring end points are associated. In this way, even when the brightness levels of an observation image are changed as observation conditions or device characteristics change, expected brightness values of the observation image can be obtained easily and automatically.

In the observation image acquisition process (step S1), a voltage contrast observation image may be acquired by irradiating a semiconductor wafer charged to a desired voltage with charged particles in a manufacturing process. In the layout acquisition process (step S2), a layout pattern of the conductive layer on the observation image may be acquired from design data about a semiconductor device formed on the semiconductor wafer. In this way, defect positions can be narrowed down in a manufacturing process, that is, before manufacturing of a semiconductor device is completed. Further, by storing the observation image and applying the present invention after manufacturing of a semiconductor device is completed, defect positions can be narrowed down without polishing a surface of the semiconductor device.

Figure 15:
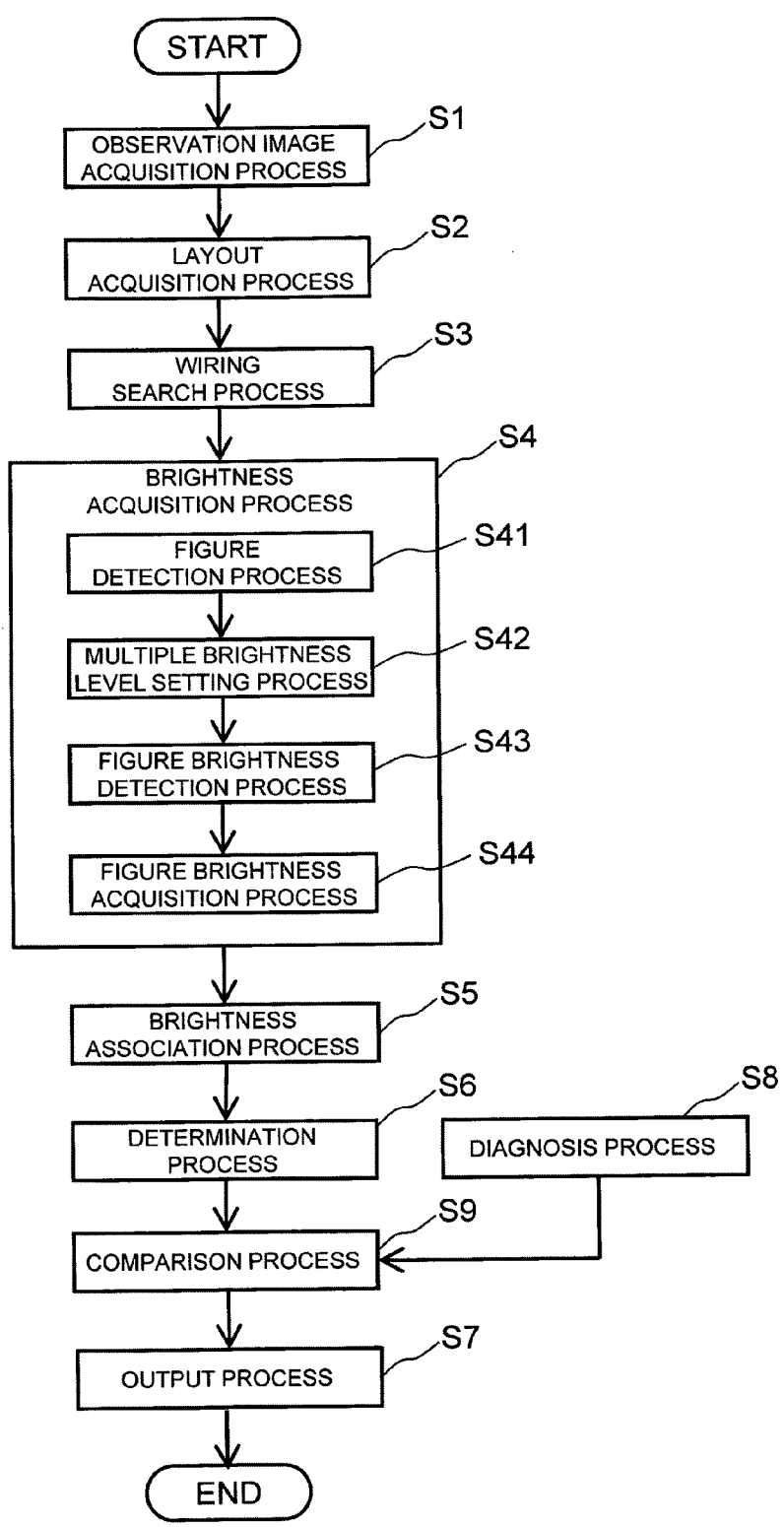
FIG. 15 is a flow chart of a semiconductor device failure analysis method according to another example.

Further, as illustrated in FIG. 15, the semiconductor device failure analysis method may further include: a diagnosis process (step S8) of calculating a circuit operation by using at least one programmed computer, design data, and test results to acquire defect positions of a defective semiconductor device as wirings (including vias) and/or instances; and a comparison process (step S9) of comparing wirings determined to be inconsistent in the determination process and/or instances connected to end points of the wirings with the wirings and/or the instances acquired in the diagnosis process to determine matching wirings and/or instances to be defect positions of the semiconductor device. In the output process (step S7), the defect positions determined in the comparison process (step S9) may also be outputted. In this way, defect positions causing abnormal circuit operations can be identified.

The semiconductor device failure analysis method may further include: an analysis process (step S10) of using another failure analysis method to identify defect positions of the semiconductor device; and a comparison process (step S9) of comparing wirings determined to be inconsistent in the determination process (step S6) and/or instances connected to end points of the wirings with wirings and/or the instances relating to the defect positions acquired in the analysis process (step S10) to determine matching wirings and/or instances to be defect positions of the semiconductor device. In the output process (step S7), the defect positions determined in the comparison process (step S9) may also be outputted. In this way, reliability of the failure analysis for determining defect positions can be increased.

Further, regarding wirings (including vias) determined to be inconsistent in the determination process (step S6), in the output process (step S7), names and coordinates of the wirings from the conductive layer on the observation image, to end points of the wirings, names and coordinates of instances connected to the end points, types of the end points, brightness levels acquired by a brightness acquisition unit, and brightness levels that are acquired by a brightness association unit and that correspond to the types of the end points may be outputted. In this way, operators do not need to check the brightness levels of a wiring pattern on an observation image one by one. Namely, since operators only need to check automatically determined defect positions, time required for failure analysis can be reduced significantly.

Figure 17A:
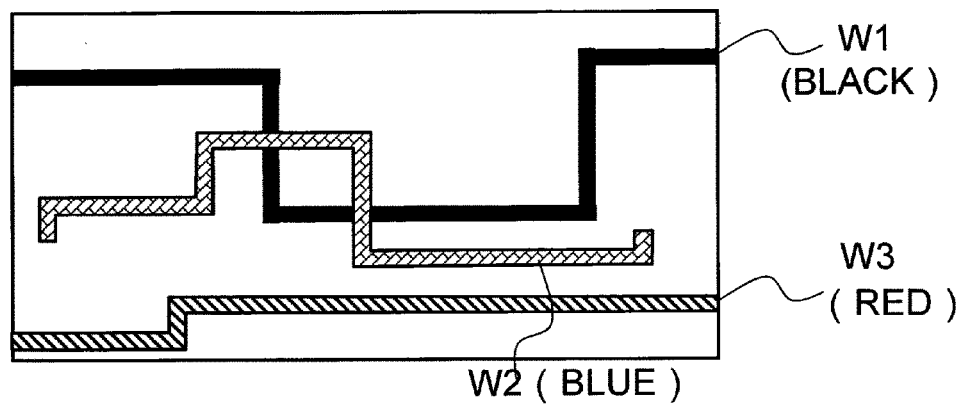
FIGS. 17A to 17C illustrate output examples of failure analysis results.
Figure 17B:
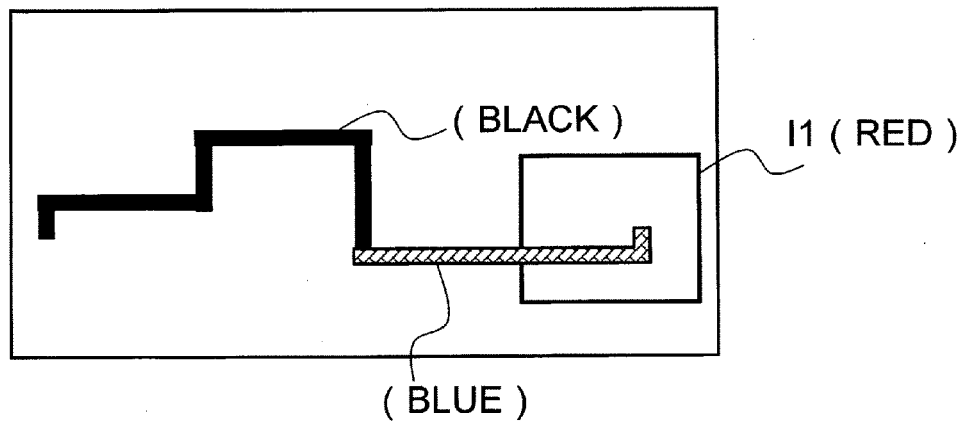
Figure 17C:
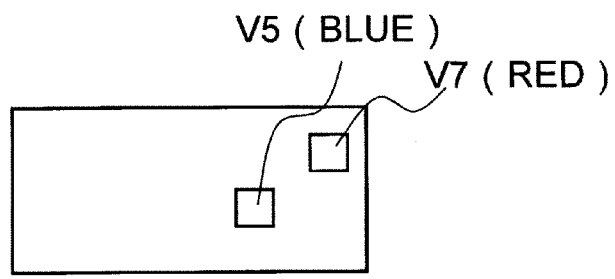

Further, as illustrated in FIGS. 17A to 17C, regarding wirings determined to be inconsistent in the determination process (step S6), in the output process (step S7), different colors are used on a layout in at least one of the following manners: (A) each of the wirings is displayed in a different color, (B) each of the wiring end points on the observation image is displayed in a different color, (C) a wiring part of each of the wirings from the conductive layer on the observation image to the end point is displayed in a different color, and (D) each of the instances connected to the end points of the wirings is displayed in a different color. In this way, defect positions can be visually determined on the layout.

Figure 18A:
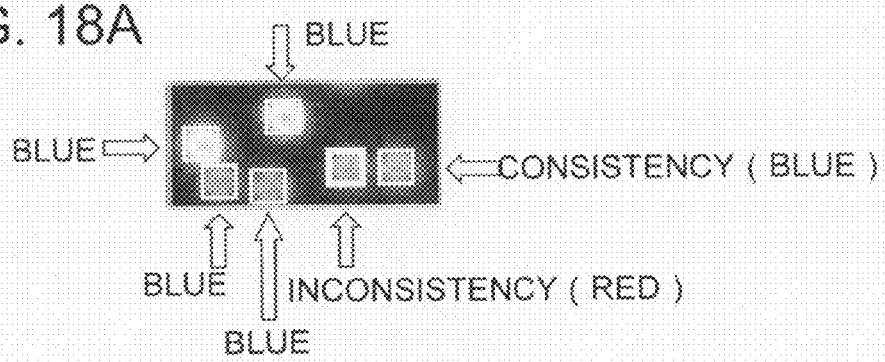
FIGS. 18A to 18C illustrate other output examples of failure analysis results.

Further, as illustrated in FIG. 18A, in the output process (step S7), a layout including wirings displayed in different colors depending on consistency/inconsistency determined in the determination process (step S6) may be superposed on an observation image and an obtained overlaid image may be displayed. In this way, defect positions can be visually determined on the layout.

Figure 18B:
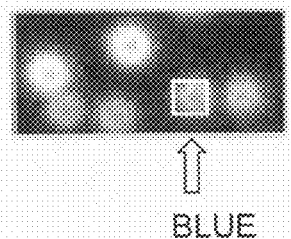

Further, as illustrated in FIG. 18B, in the output process (step S7), a layout including wirings determined to be inconsistent in the determination process (step S6) may be superposed on an observation image and an obtained overlaid image may be displayed. In this way, defect positions can be visually determined on the layout.

Figure 18C:
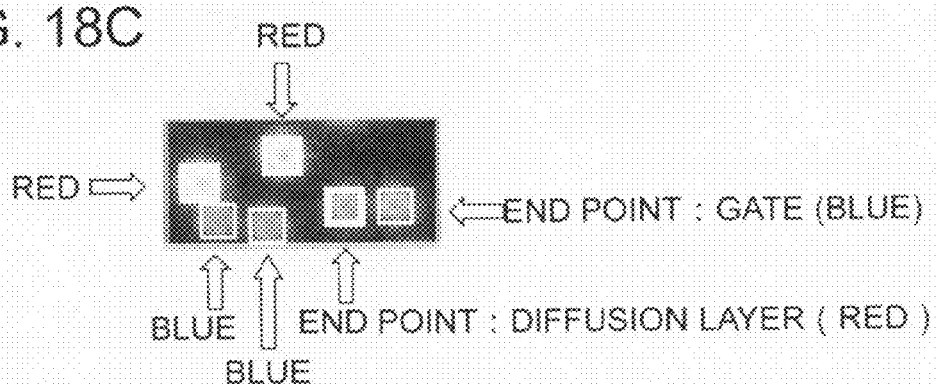

Further, as illustrated in FIG. 18C, in the output process (step S7), a layout including wirings displayed in different colors depending on the end points of the wirings may be superposed on an observation image and an obtained overlaid image may be displayed. In this way, end points of the wiring pattern on the observation image can be visually identified.

Figure 19:
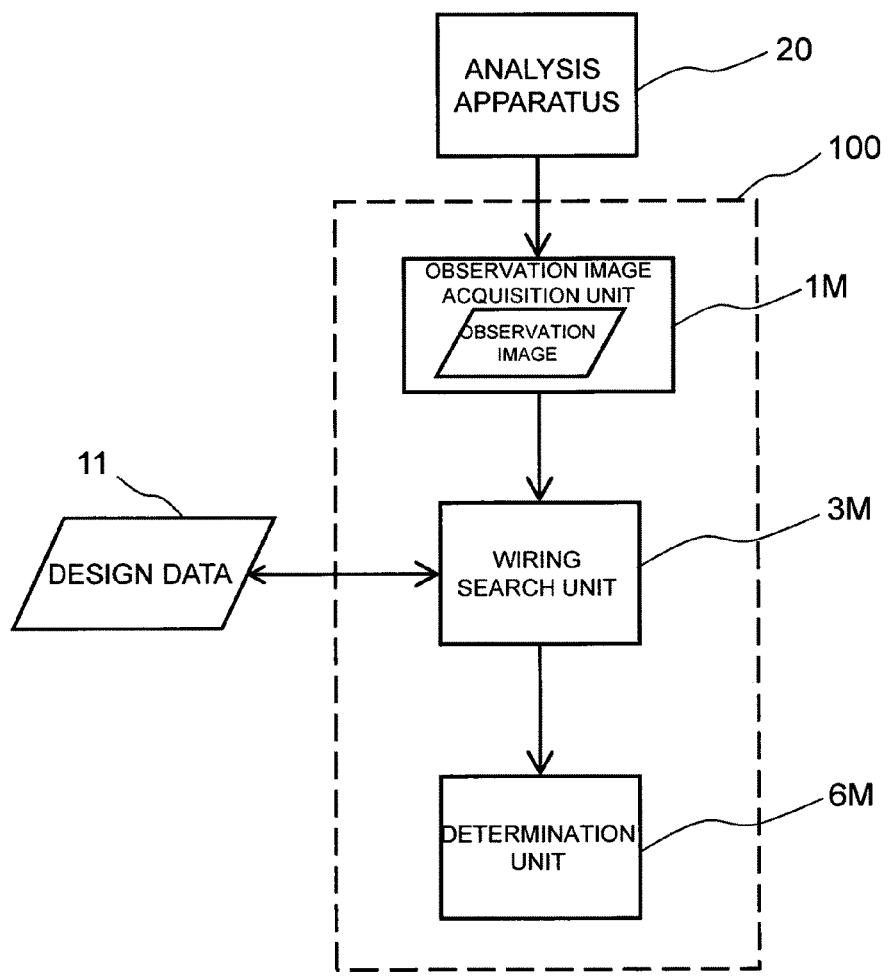
FIG. 19 is a block diagram of a schematic configuration of a semiconductor device failure analysis apparatus according to an example of the present invention.

Further, as illustrated in FIG. 19, a semiconductor device failure analysis apparatus 100 according to an exemplary embodiment of the present invention includes: an observation image acquisition unit 1M charging an exposed conductive layer of a semiconductor device to a desired voltage and irradiating the conductive layer with charged particles to acquire an observation image of the conductive layer having a voltage contrast; a wiring search unit 3M of searching for end points connected to the conductive layer based on design data 11; and a determination unit 6M of comparing voltage contrasts of three levels or more set in advance, one of which is set for a wiring depending on a state of an end point of the wiring, with the voltage contrast image acquired in the observation image acquisition unit 1M to determine consistency/inconsistency.

Based on the above configuration, since multiple voltage contrasts of three levels or more are set, it is possible to detect a disconnection defect or a short-circuit defect, which cannot be detected by the absorption electric potential method disclosed in Patent Document 2.

Further, since the semiconductor device failure analysis apparatus includes the wiring search unit 3M searching for end points connected to the conductive layer based on the design data 11, it is possible to acquire a state of each of the end points connected to the conductive layer from the design data 11. Namely, it is possible to determine whether an end point is connected to an N-type semiconductor layer, to a P-type semiconductor layer, to a gate electrode, or to a floating element. If necessary, necessary information, for example, the number of connected semiconductor layers or gate electrodes or the area of a connected semiconductor layer or gate electrode can be acquired. Thus, defect positions can be narrowed down based on a voltage contrast image of a single defective device alone, without comparing the defective device with a non-defective device.

Figure 20:
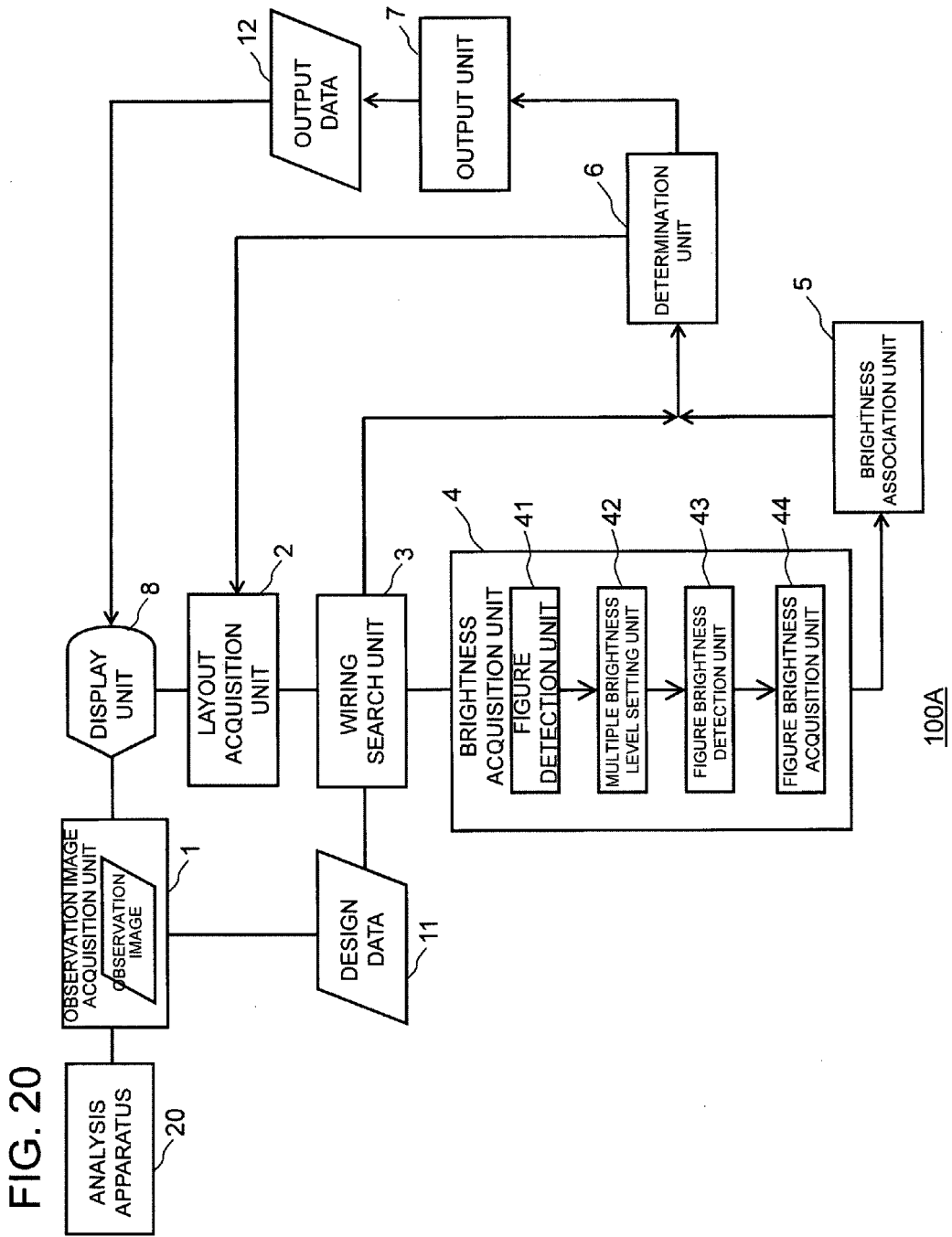
FIG. 20 is a block diagram of an overall configuration of a semiconductor device failure analysis apparatus according to an example.
Figure 21:
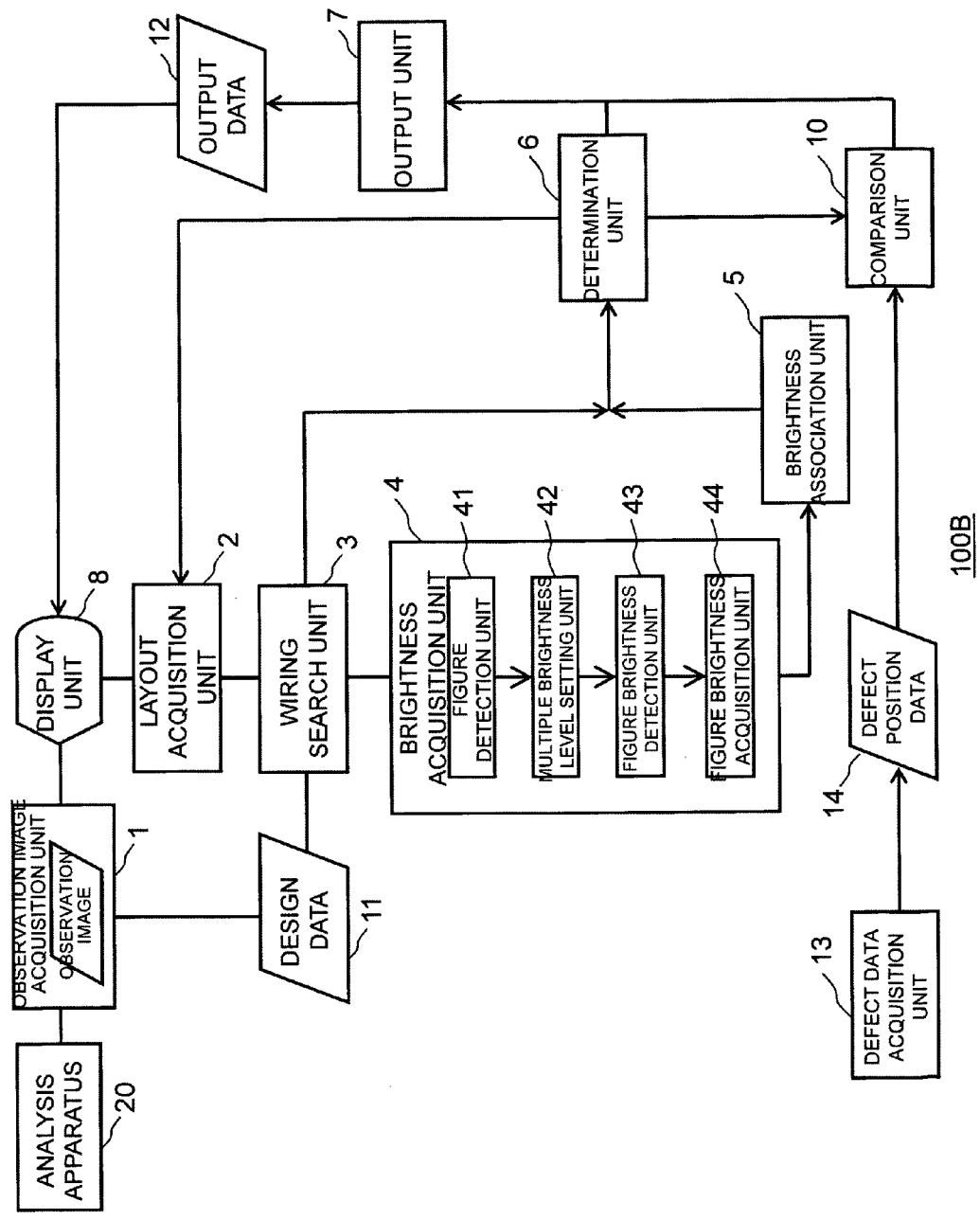
FIG. 21 is a block diagram of an overall configuration of a semiconductor device failure analysis apparatus according to another example.

Further, as illustrated in FIGS. 20 and 21, the semiconductor device failure analysis apparatus may further include: an output unit 7 outputting information identifying positions determined to be inconsistent as a results of processing by the determination unit 6; and a display unit 8 displaying information outputted by the output unit 7. Regarding wirings determined to be inconsistent by the determination unit 6, the output unit 7 may output: names and coordinates of the wirings from the conductive layer on the observation image to the end points of the wirings; names and coordinates of instances connected to the end points; types of the end points; brightness levels acquired by the brightness acquisition unit; and brightness levels that are acquired by the brightness association unit and that correspond to the types of the end points. The display unit 8 may display the processing results, the observation image, the observation image having multilevel brightness levels, and the layout outputted by the output unit 7, so that an exposed conductive layer can be specified, a table indicating a correspondence relationship between brightness levels and wiring end points can be created or edited, and figures detected by the figure detection unit 41 can be displayed. The display unit 8 may display information so that image processing parameters for detecting figurative elements can be changed. Edges and detected figurative elements in an observation image are updated every time the image processing parameters are changed. In addition, the display unit 8 may display information, so that brightness thresholds set by the multiple brightness level setting unit 42 can be changed. The display unit 8 may display results obtained by the figure brightness detection unit 43, and every time the brightness thresholds are changed, since the multiple brightness levels are accordingly changed, an observation image may be updated.

Since image processing parameters can be changed, figurative elements on the observation image can be properly extracted. In addition, since the brightness thresholds can be changed, multiple brightness levels can be properly obtained.

Further, the figure brightness acquisition unit 44 may carry out a pattern matching image process on the figurative elements detected by the figure detection unit 41 and a layout pattern to extract the figurative elements corresponding to the layout pattern and the brightness levels detected by the figure brightness detection unit 43. The display unit 8 may display information so that image processing parameters for the pattern matching image process can be changed. In this way, since the image processing parameters can be changed, accurate pattern matching results can be obtained relatively easily.

The outlines of the exemplary embodiments have thus been described. Hereinafter, more specific examples will be described in detail with reference to the drawings.

EXAMPLE 1

FIG. 1 is a flow chart illustrating general processes of a semiconductor device failure analysis method according to example 1 of the present invention. In an observation image acquisition process (step S1M), an exposed conductive layer of a semiconductor device is charged and irradiated with charged particles to acquire a voltage contrast image. In a wiring search process (step S3M), end points connected to the charged conductive layer exposed on a surface of the semiconductor device are searched for based on design data. In a determination process (step S6M), voltage contrasts of three levels or more set in advance, one of which is set for a wiring depending on a state of an end point of the wiring, are compared with the voltage contrast image acquired in the observation image acquisition process (step S1M) to detect consistency/inconsistency among the voltage contrasts. In the field of semiconductor device failure analysis apparatuses, these voltage contrasts are generally displayed as brightness levels. However, alternatively, the voltage contrasts may be displayed as colors, for example.

FIG. 2 is a flow chart illustrating detailed processes of the semiconductor device failure analysis method according to example 1. FIGS. 1 and 2 are related to each other. Specifically, a layout acquisition process (step S2) of FIG. 2 is included in the wiring search process (step S3M) of FIG. 1, and a brightness acquisition process (step S4), a brightness association process (step S5), and an output process (step S7) of FIG. 2 are included in the determination process (step S6M) of FIG. 1.

In the detailed flow chart of FIG. 2, in the observation image acquisition process (step S1), first, a semiconductor device is polished until a conductive layer is exposed.

Figure 3:
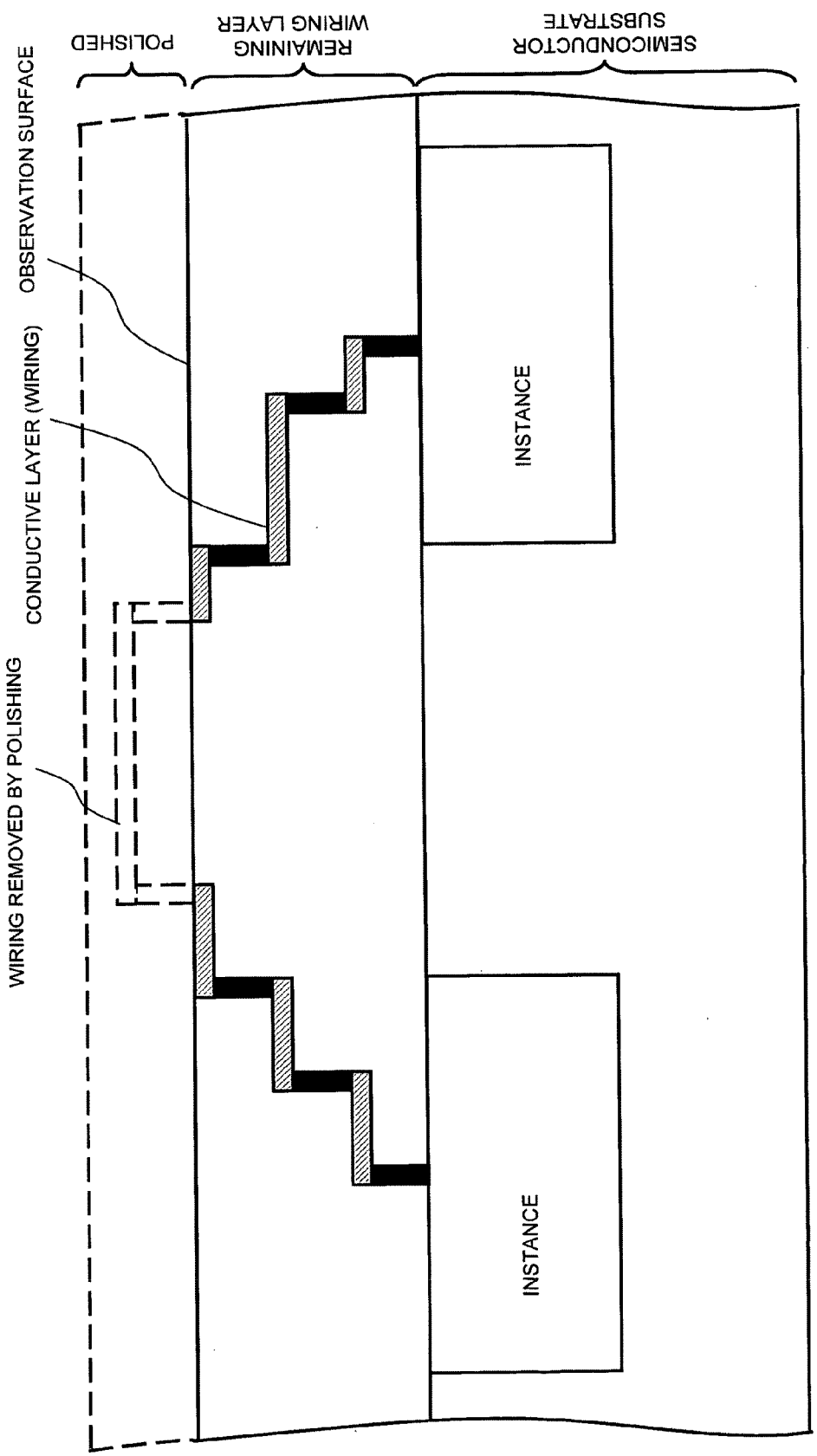
FIG. 3 is a sectional view of a structure example of a semiconductor device to be analyzed for defects.

Hereinafter, a structure of a semiconductor device to be analyzed will be described. FIG. 3 is a sectional view of a structure example of a semiconductor device 50 to be analyzed. The semiconductor device 50 includes a semiconductor substrate, and a wiring layer is formed on a surface of the semiconductor substrate. Part of the wiring layer is removed by polishing, and a conductive layer (wirings) is exposed on the surface of the semiconductor device. The remaining wirings that are not removed by polishing are connected to functional circuits referred to as instances (or cells, transistors, etc.) formed on a surface of the semiconductor substrate.

Figure 4A:
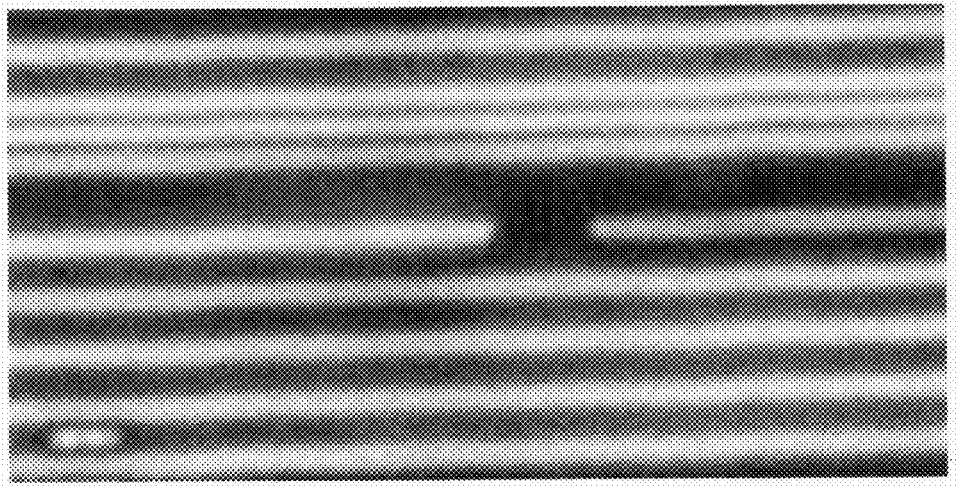
FIG. 4A shows an example of an image of an observation surface of the semiconductor device.

When an observation surface of the semiconductor device is observed, as illustrated in FIG. 4A, it can be seen that some of the wirings (conductive layer) of FIG. 3 are exposed. The wirings that were present above the observation surface (the wirings indicated by dashed lines in FIG. 3) have been removed by polishing. In this state, the semiconductor device is charged to a desired voltage and is next irradiated with charged particles.

Figure 4B:
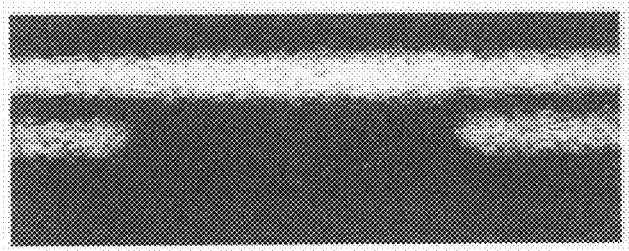
FIG. 4B shows an example of a voltage contrast image when the observation surface includes a wiring layer.
Figure 4C:
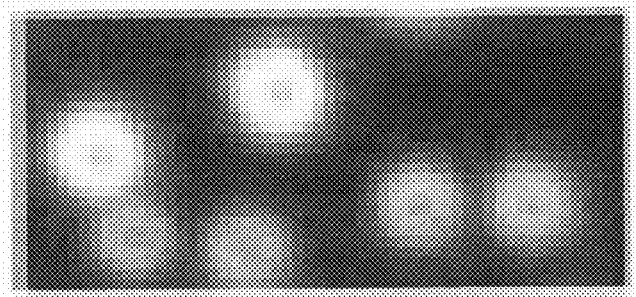
FIG. 4C shows a voltage contrast image when the observation surface includes a via layer.

For example, a SEM can be used. First, the semiconductor device is charged to a certain voltage and is next irradiated with charged particles by an electron beam. Next, secondary electrons released from the semiconductor device are detected, and the surface (namely, the observation surface) of the semiconductor device is observed. In this way, an image having contrasts that are different depending on the voltages on the surface of the semiconductor device can be obtained. FIG. 4B shows an example of a voltage contrast image. Further, FIG. 4C shows an example of a voltage contrast image when the observation surface includes a via layer, namely, when the conductive layer is a via layer. If the wiring layer of FIG. 3 is polished until wirings extending horizontally in parallel to the surface of the semiconductor device 50 are exposed, a voltage contrast image as shown in FIG. 4B can be obtained. If the wiring layer of FIG. 3 is polished until a via layer is exposed on the surface, a voltage contrast image as shown in FIG. 4C can be obtained.

The voltage contrast image exhibits different contrasts, depending on the type of each end point connected to the conductive layer on the observation surface. The end points will be hereinafter described based on a MOS transistor device as an example. First, a MOS transistor device is polished until a surface of a first via layer is exposed on the observation surface. FIG. 5 is a sectional view of the MOS transistor device including the first via layer exposed on the observation surface. In FIG. 5, the first via layer is connected to a first wiring layer. Except for a floating element, wirings connected to gates, a P diffusion, and an N diffusion are connected to polysilicon as gate electrodes, a N+ diffusion layer as a source/drain of an NMOS transistor, and a P+ diffusion layer as a source/ drain of a PMOS transistor via a contact layer arranged under the first wiring layer, respectively. The NMOS transistor is formed on a P-type silicon substrate or a P-type well, and the PMOS transistor is formed on an N-type silicon substrate or an N-type well. Further, a shallow trench isolation (STI) separates the P-type silicon substrate on which the NMOS transistor is formed from the N-type silicon substrate on which the PMOS transistor is formed. Needless to say, the P-type silicon substrate may be a P-type well formed on a surface of the N-type silicon substrate, and the N-type silicon substrate may be an N-type well formed on a surface of the P-type silicon substrate.

The observation surface of the semiconductor device may be charged in a positive voltage contrast (PVC) mode or in a negative voltage contrast (NVC) mode. FIG. 6 illustrates a voltage contrast image of a MOS transistor device obtained in the PVC mode. For example, when a wiring end point is a P diffusion, if the observation surface is charged positively, electron transfer from the silicon substrate is carried out under forward bias. Thus, since electrons are supplied, charging is not facilitated, and as a result, a high contrast is obtained. If no current flows because of a high resistance defect or the like, supply of electrons is reduced. Thus, since charging is facilitated, a low contrast is obtained. Further, when a wiring end point is an N diffusion, if the observation surface is charged positively, the P-type silicon substrate and the N diffusion are reversely biased, and therefore, transfer of carriers is not facilitated. Thus, since charging is more facilitated compared with when the end point is a P diffusion, a low contrast is obtained. Further, when a wiring end point is a gate electrode, since charging is further facilitated compared with when the end point is an N diffusion, an even lower contrast than that obtained in the case of an N diffusion is obtained.

Figure 7A:
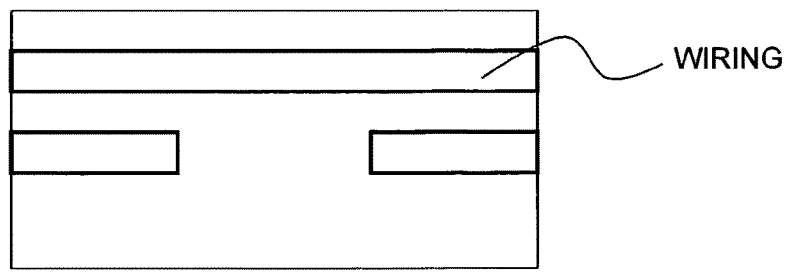
FIG. 7A illustrates a layout when the observation surface includes a wiring layer.
Figure 7B:
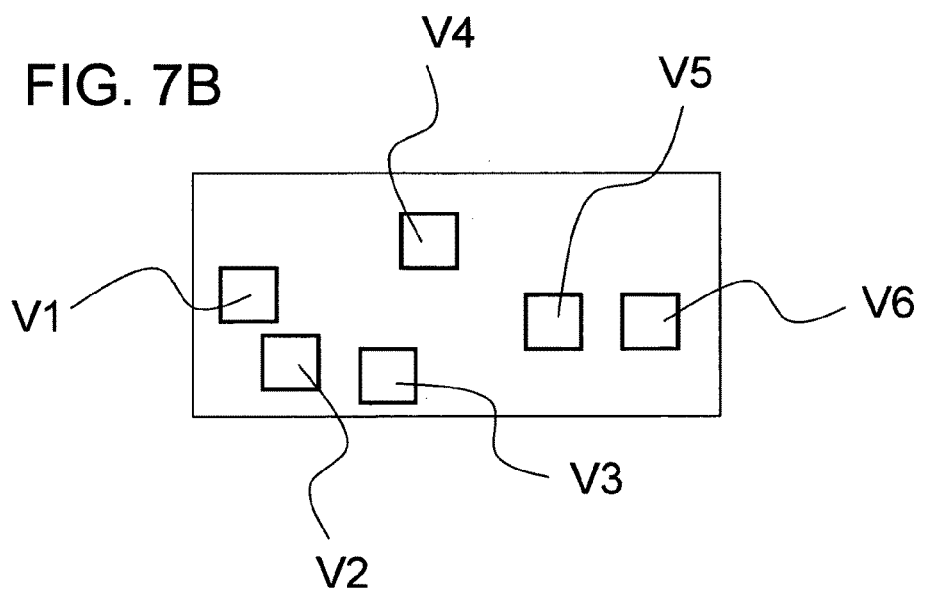
FIG. 7B illustrates a layout when the observation surface includes a via layer.

Referring to the detailed flow chart of FIG. 2 again, in the layout acquisition process (step S2), a layout pattern of the conductive layer on the observation image is acquired from semiconductor device design data. FIGS. 7A and 7B illustrate examples of such an acquired layout. FIGS. 7A and 7B illustrate layouts of the voltage contrast images of FIGS. 4B and 4C, respectively. In this way, layout images and coordinates are acquired from layout data about at least the observation image.

In the wiring search process (step S3), by using the layout data about the layout pattern that is acquired in the layout acquisition process (step S2) and that corresponds to the conductive layer on the observation image, wiring end points connected to the layout pattern are searched for. Since an upper layer of the observation surface is removed from the semiconductor device, wiring end points connected to the conductive layer are searched from under the observation surface. In this example, the description will be made based on the assumption that layout data about the wiring layer above the observation surface is not present. The layout data of wiring layers above the observation surface layer are ignored in this wiring search process. Generally, a wiring end point of a MOS transistor device is any one of a P diffusion, an N diffusion, a gate, and a floating element.

In the brightness acquisition process (step S4), image processing is carried out to acquire brightness levels of the observation image corresponding to the layout pattern searched for in the wiring search process. The brightness acquisition process (step S4) includes a figure detection process (step S41), a multiple brightness level setting process (step S42), a figure brightness detection process (step S43), and a figure brightness acquisition process (step S44).

Figure 8A:
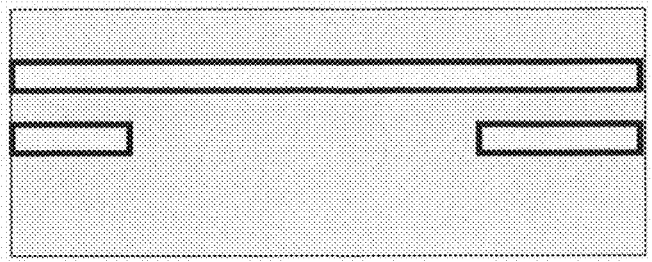
FIGS. 8A and 8B illustrate figurative elements obtained by extracting edges from an observation image when an observation surface includes a wiring layer and a via layer, respectively.
Figure 8B:
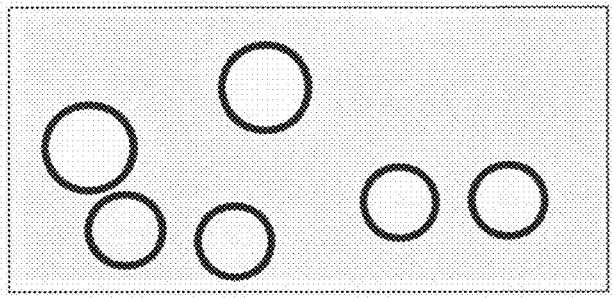

In the figure detection process (step S41), figurative elements of an observation image are detected by extracting edges of the observation image. FIGS. 8A and 8B illustrate examples of the figurative elements detected by extracting edges of the observation images of FIGS. 4B and 4C, respectively. Edges are detected based on the color information concerning each pixel of the observation image, and figurative elements are extracted based on the edges of the image.

The figurative elements detected in the figure detection process (step S41) are rectangular in FIG. 8A and circular or elliptical in FIG. 8B. However, the detected figurative elements are not limited to such figures. Arbitrary figures may be detected.

In the multiple brightness level setting process (step S42), first, brightness thresholds are set. FIG. 9A illustrates brightness thresholds to set four brightness levels. To set four brightness levels, three thresholds T1 to T3 are set. Namely, when n brightness levels are set (n is an integer of 3 or greater), (n−1) thresholds are set. Next, the brightness thresholds T1 to T3 are used to provide each pixel of the observation image with a brightness level. FIG. 9B illustrates a range of each of the brightness levels. Pixels that fall within a brightness range 0 to 63 are determined to have a brightness level B1. Pixels that fall within a brightness range 64 to 127 are determined to have a brightness level B2.

While each pixel of the figurative elements detected in the figure detection process (step S41) is provided with one of the brightness levels set in the multiple brightness level setting process (step S42), in the figure brightness detection process (step S43), a majority brightness level in each figurative element is determined to be the brightness of the figurative element. FIGS. 9C and 9D are examples in which each pixel of the observation images of FIGS. 4B and 4C is provided with one of the brightness levels and a majority brightness level in each figurative element is determined to be the brightness of the figurative element, respectively. Namely, even if a figurative element is formed by various pixels having all the brightness levels B1 to B4, if the number of pixels having the brightness level B2 is the greatest, the entire figurative element is determined to have brightness B2.

In the figure brightness acquisition process (step S44), the brightness levels detected in the figure brightness detection process (step S43) are extracted from the figurative elements corresponding to the layout pattern, among the figurative elements detected in the figure detection process (step S41). If the brightness levels are set as illustrated in FIG. 9A, brightness levels of the figurative elements corresponding to the individual layout patterns of FIG. 4B are determined to be B1, B2, and B4, as illustrated in FIG. 9C. Brightness levels of the figurative elements corresponding to the individual layout patterns of FIG. 4C are determined to be B1, B2, and B4, as illustrated in FIG. 9D.

In the brightness association process (step S5), a table indicating a correspondence relationship between multiple brightness levels of an observation image and wiring end points connected to the layout pattern corresponding to the observation image is created in advance. Namely, since brightness levels of an observation image of a conductive layer are dependent on end points connected to the conductive layer, the brightness levels and the wiring end points are associated. FIG. 10A illustrates a table indicating a correspondence relationship between the brightness levels and the wiring end points. A wiring end point may be connected to only a gate, a P diffusion, or an N diffusion, both a gate and a P diffusion, both a gate and an N diffusion, both an N diffusion and a P diffusion, or a combination of a gate, a P diffusion, and an N diffusion. A brightness level is also set for a floating element. In addition, a brightness level may be set for the background of the observation image.

In the determination process (step S6), whether the brightness levels of the layout pattern (observation image) acquired in the brightness acquisition process (step S4) and the wiring end points that are acquired in the wiring search process (step S3) and that are connected to the layout pattern are consistent with the correspondence relationship between the brightness levels and the wiring end points acquired in the brightness association process (step S5) is determined. FIG. 7B illustrates a layout when the observation surface includes a via layer. FIG. 9D illustrates an observation image in which brightness levels are assigned to the figurative elements corresponding to the layout pattern. FIG. 10B illustrates the wiring end points that are acquired in the wiring search process and that are connected to the layout pattern corresponding to the observation image. FIG. 10A illustrates the table indicating a correspondence relationship between the brightness levels and the wiring end points. When the brightness levels of the observation image of FIG. 9D and the end point types of the layout pattern of FIG. 10B are compared with the table of FIG. 10A illustrating the correspondence relationship between the brightness levels and the wiring end points, it is seen that, while there is consistency about vias V1 to V4, and V6, there is inconsistency about a via V5. Namely, the observation image shows that the via V5 has the brightness level B2 as shown in FIG. 9D, and the design data shows that the wiring end point of the via V5 is a P diffusion as illustrated in FIG. 10B. When this brightness and the wiring end point are compared with the table of FIG. 10A illustrating the correspondence relationship between the brightness levels and the wiring end points, it is seen that the via V5 need to have the brightness level B4. Thus, it is clear that the brightness B2 in FIG. 9D is inconsistent with the brightness level B4 in FIG. 10A.

FIG. 10C illustrates another example different from those in FIGS. 7B and 10B illustrating a layout of the observation surface including a via layer. FIG. 10C illustrates a layout including a via V7 of which end point is a P diffusion. Assuming that the figurative elements on the observation image corresponding to the layout pattern are provided with the brightness levels as illustrated in FIG. 9D, since the via V7 has a very low brightness on the observation image of FIG. 9D, the figurative element of the via V7 is not detected in the figure detection process (step S41). In this case, the via V7 is determined to have the brightness level B1. Since the end point of the via V7 is a P diffusion, when the brightness and the end point are compared with the table of FIG. 10A indicating the correspondence relationship between the brightness levels and the wiring end points, inconsistency is determined in the determination process (step S6).

In the output process (step S7), results of the determination process (step S6) are outputted. Regarding the vias V5 and V7 determined to be inconsistent in the determination process (step S6), names and coordinates of the wirings extending from the conductive layer (V5 and V7) on the observation surface to the end points are outputted. Names and coordinates of instances connected to the end points may be outputted. Types of the end points, the brightness levels obtained in the brightness acquisition process, and the brightness levels that are obtained in the brightness association process and that correspond to the types of the end points are outputted.

Next, examples of a relationship between a defect and a voltage contrast will be described with reference to the drawings.

Figure 11A:
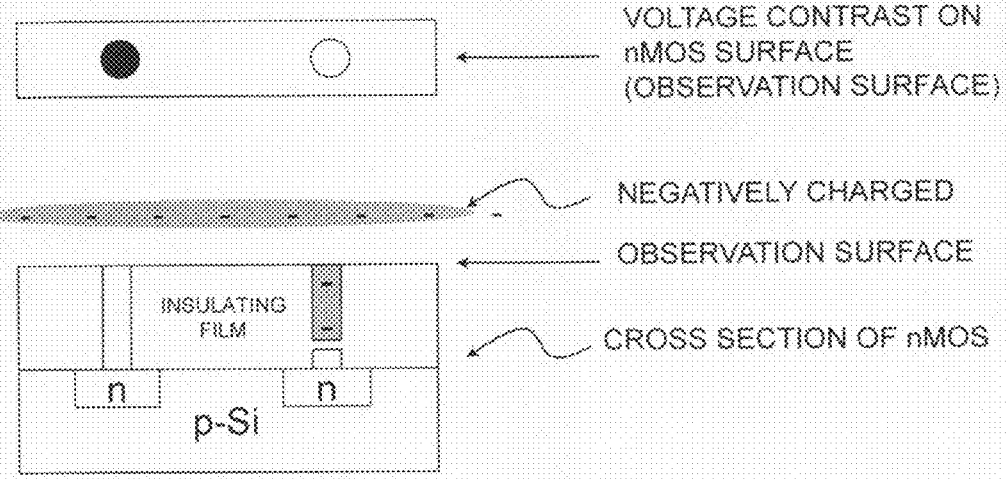
FIG. 11A illustrates voltage contrasts when a wiring having an end point connected to a diffusion layer of an NMOS transistor has a disconnection defect.

FIG. 11A illustrates a disconnection defect of a wiring connected to a diffusion layer of an NMOS transistor. If the observation surface is negatively charged in the NVC mode, in the case of a non-defective wiring, electrons are transferred from the silicon substrate under forward bias. Thus, since electrons are supplied, charging is not facilitated, and as a result, a low contrast is obtained. For example, if a high resistance defect is present or if no current flows, since charging is facilitated, a high contrast is obtained.

Figure 11B:
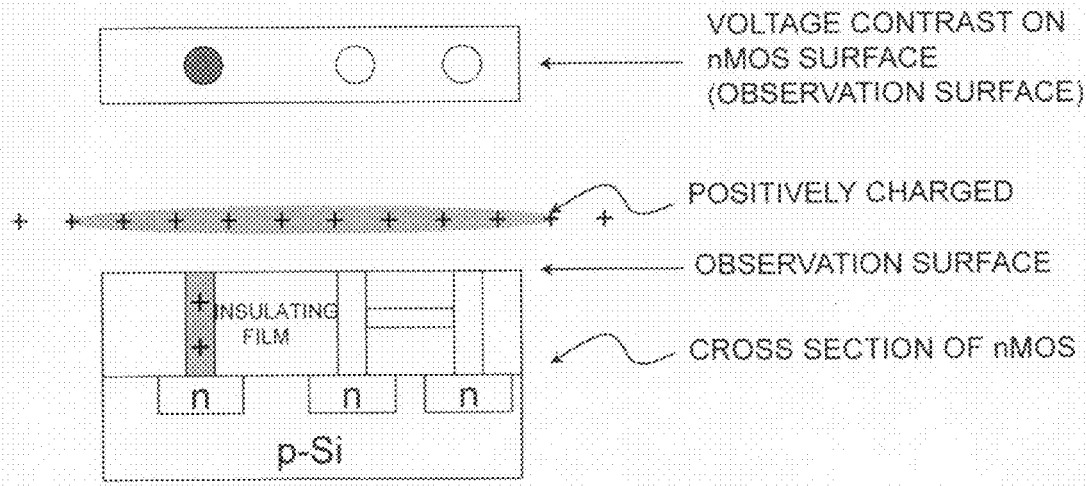
FIG. 11B illustrates voltage contrasts when the wiring has a short-circuit defect.

FIG. 11B illustrates a short-circuit defect of a wiring connected to a diffusion layer of an NMOS transistor. For example, if the observation surface is positively charged in the PVC mode and an electron supply path is formed by a short-circuit defect, since charging is not carried out, a high contrast is obtained. While FIG. 11B illustrates only a cross section of the NMOS transistor, if a short-circuit is formed with a wiring connected to a P diffusion of a PMOS transistor, since the P diffusion and the N-type substrate of the PMOS transistor are forward biased, charging is not facilitated in particular.

Figure 12A:
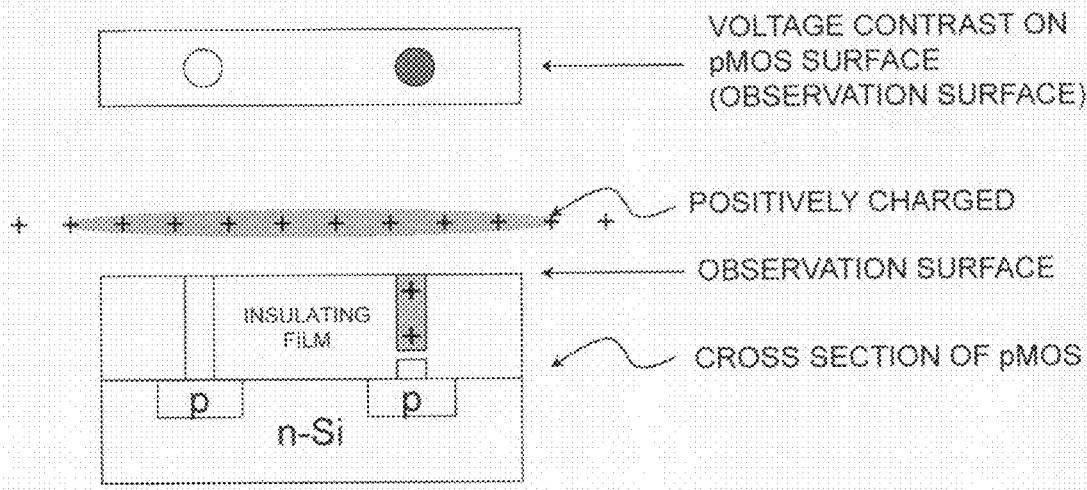
FIG. 12A illustrates voltage contrasts when a wiring having an end point connected to a diffusion layer of a PMOS transistor has a disconnection defect.

FIG. 12A illustrates a disconnection defect of a wiring connected to a diffusion layer of a PMOS transistor. If the observation surface is positively charged in the PVC mode, electrons are transferred from the silicon substrate under forward bias. Thus, since electrons are supplied, charging is not facilitated, and as a result, a high contrast is obtained. If the circuit is brought in a nonconductive state because of a high resistance defect or the like, since supply of electrons is reduced, charging is facilitated, and as a result, a low contrast is obtained.

Figure 12B:
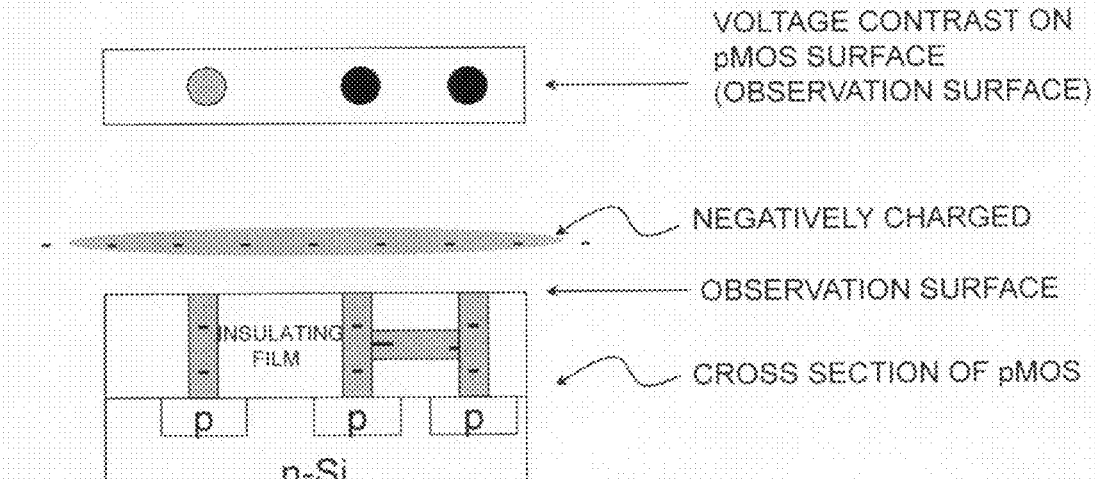
FIG. 12B illustrates voltage contrasts when the wiring has a short-circuit defect.

FIG. 12B illustrates a short-circuit defect of a wiring connected to a diffusion layer of a PMOS transistor. If the observation surface is negatively charged in the NVC mode and a short-circuit defect is present, since charging is not facilitated as compared with when a non-defective wiring is charged, a low contrast is obtained. In particular, if a short-circuit is formed with a wiring connected to a diffusion layer of an NMOS transistor, since the diffusion layer and the substrate of the NMOS transistor are forward biased, charging is not facilitated.

Figure 13A:
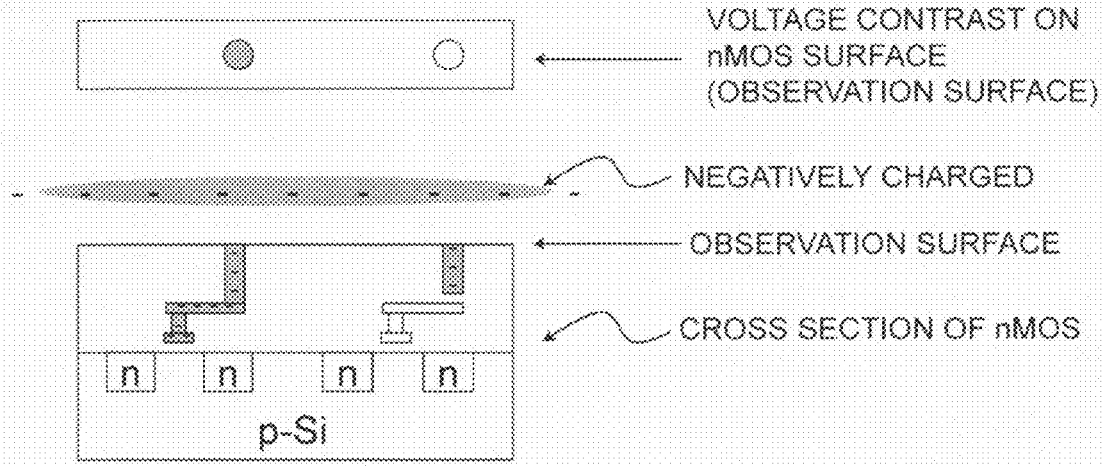
FIG. 13A illustrates voltage contrasts when a wiring connected to a gate of an NMOS transistor has a disconnection defect.

FIG. 13A illustrates a disconnection defect of a wiring connected to a gate of an NMOS transistor. If a disconnection defect is present, since the parasitic capacitance is reduced, charging is facilitated more quickly, as compared with when no disconnection defect is present. If a short-circuit defect is present, since charging is not facilitated, multiple brightness levels (three levels or more) are set to determine a defect. In this way, whether the conductive layer is properly connected to a gate, whether a disconnection defect is present, or whether a short-circuit defect is present can be identified. In FIG. 13A, the observation surface is negatively charged in the NVC mode. To determine whether a wiring connected to a gate involves a disconnection defect as illustrated in FIG. 13A, the observation surface may be charged either positively in the PVC mode or negatively in the NVC mode.

Figure 13B:
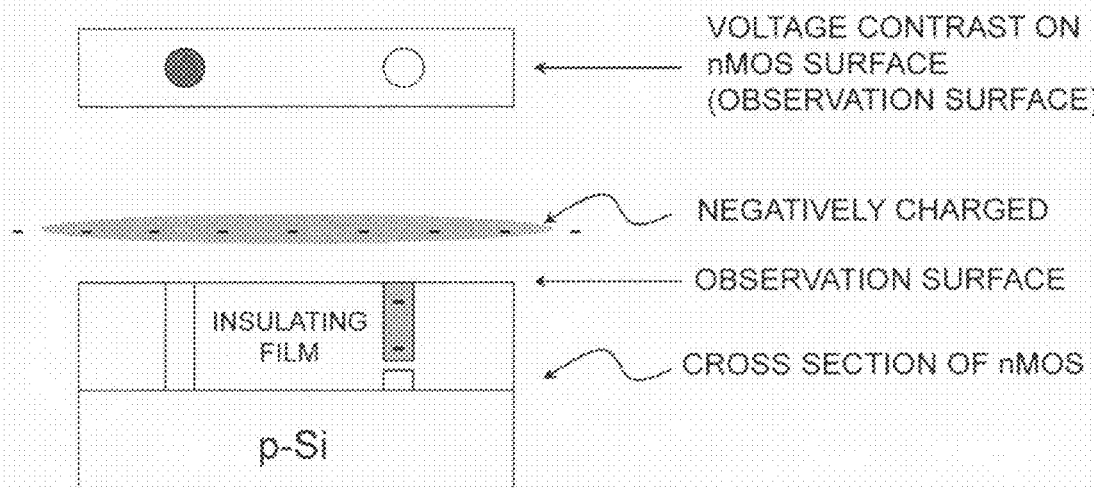
FIG. 13B illustrates voltage contrasts when a wiring connected to a P-type substrate has a disconnection defect.

FIG. 13B illustrates a disconnection defect of a wiring connected to a plug of an NMOS transistor. Since a defective wiring having a disconnection defect is charged differently from a non-defective wiring, a difference is caused in contrast. In FIG. 13B, the observation surface is negatively charged in the NVC mode. To determine whether a wiring connected to a transistor plug involves a disconnection defect as illustrated in FIG. 13B, the observation surface may be charged positively in the PVC mode.

As described with the above examples, a wiring exhibits a different charged state depending on the presence of a defect or the type of a defect. Accordingly, a different voltage contrast is exhibited. The present invention is not limited to the above examples. A failure analysis can be carried out by detecting a contrast difference attributable to a difference in a wiring charged state and comparing a detected voltage contrast with an expected voltage contrast obtained based on a wiring end point type. Particularly, by appropriately setting thresholds to obtain multiple brightness levels (three or more levels), defects that cannot be identified by a simple binary determination can be determined.

EXAMPLE 2

A semiconductor device failure analysis method according to example 2 will be described with reference to the drawings. According to example 2, in the multiple brightness level setting process (step S42), a pixel number distribution is obtained for each brightness level to automatically calculate brightness thresholds, the number of brightness levels, and values of the individual brightness levels. FIG. 14 illustrates brightness levels of an observation image and a pixel number distribution for each of the brightness levels. For example, to automatically calculate brightness thresholds, the number of brightness levels, and values of the individual brightness levels, first, two pixel number thresholds T1 and T2 are given. Next, brightness ranges corresponding to the pixel number threshold T1 or less and brightness ranges corresponding to the pixel number threshold T2 or more are extracted. Next, brightness ranges each including a single brightness range corresponding to the pixel number threshold T2 or more and two brightness ranges that correspond to the pixel number threshold T1 or less and that sandwich the single brightness range corresponding to the pixel number threshold T2 or more are extracted. A brightness value corresponding to a minimum pixel number in each brightness range corresponding to the pixel number threshold T1 or less is determined to be a brightness threshold. As a result, four brightness levels B1 to B4 are set. In each of the individual brightness levels B1 to B4, a value of a majority or median brightness level may be used, as long as the brightness levels B1 to B4 can be distinguished. Other processes are the same as those of example 1. Namely, according to example 2, the table of FIG. 10A illustrating the correspondence relationship between brightness levels and end points still needs to be obtained in advance. However, brightness thresholds illustrated in FIG. 9A are obtained later.

EXAMPLE 3

According to a semiconductor device failure analysis method of example 3, in the figure brightness acquisition process (step S44), a pattern matching image process is carried out on the figurative elements detected in the figure detection process (step S41) and a layout pattern. In this way, figurative elements corresponding to the layout pattern are extracted, and brightness levels detected in the figure brightness detection process are extracted. For example, a pattern matching image process is carried out on the layout pattern (FIG. 7A) and the figurative elements (FIG. 8A) detected in the figure detection process to associate the layout pattern and the figurative elements. Other processes are the same as those of example 1.

EXAMPLE 4

According to example 4, in the brightness association process (step S5), the multiple observation image brightness levels set in the multiple brightness level setting process (step S42) are associated with wiring end points. Since multiple brightness levels slightly differ depending on each observation image, instead of creating a table indicating a correspondence relationship between brightness levels and wiring end points in advance, the correspondence relationship may be created based on the brightness levels set in the multiple brightness level setting process. Other processes are the same as those of example 1.

EXAMPLE 5

According to example 5, in the observation image acquisition process (step S1), a voltage contrast image is acquired by irradiating a semiconductor wafer charged to a desired voltage with charged particles in a manufacturing process. In the layout acquisition process (step S2), a layout pattern of the conductive layer on the observation image is acquired from design data about a semiconductor device formed on the semiconductor wafer. By using a semiconductor wafer in a manufacturing process, a voltage contrast image can be obtained without a process of polishing a semiconductor device surface until an observation surface is exposed. Other processes are the same as those of example 1.

EXAMPLE 6

According to example 6, as illustrated in a flow chart of FIG. 15, the failure analysis method further includes a diagnosis process (step S8) of calculating a circuit operation by using at least one programmed computer, design data, and test results to acquire defect positions of a defective semiconductor device as wirings and/or instances. The failure analysis method further includes a comparison process (step S9) of comparing wirings determined to be inconsistent in the determination process (step S6) and/or instances connected to end points of the wirings with the wirings and/or the instances acquired in the diagnosis process (step S8) to determine matching wirings and/or instances to be defect positions of the semiconductor device. Further, in the output process (step S7), the defect positions determined in the comparison process are also outputted. Other than the diagnosis process (step S8), the comparison process (step S9), and the output process (step S7) of the flow chart of FIG. 15, processes of example 6 are the same as those of example 1 illustrated in the detailed flow chart of FIG. 2. Thus, repetitive descriptions will be omitted.

EXAMPLE 7

Figure 16:
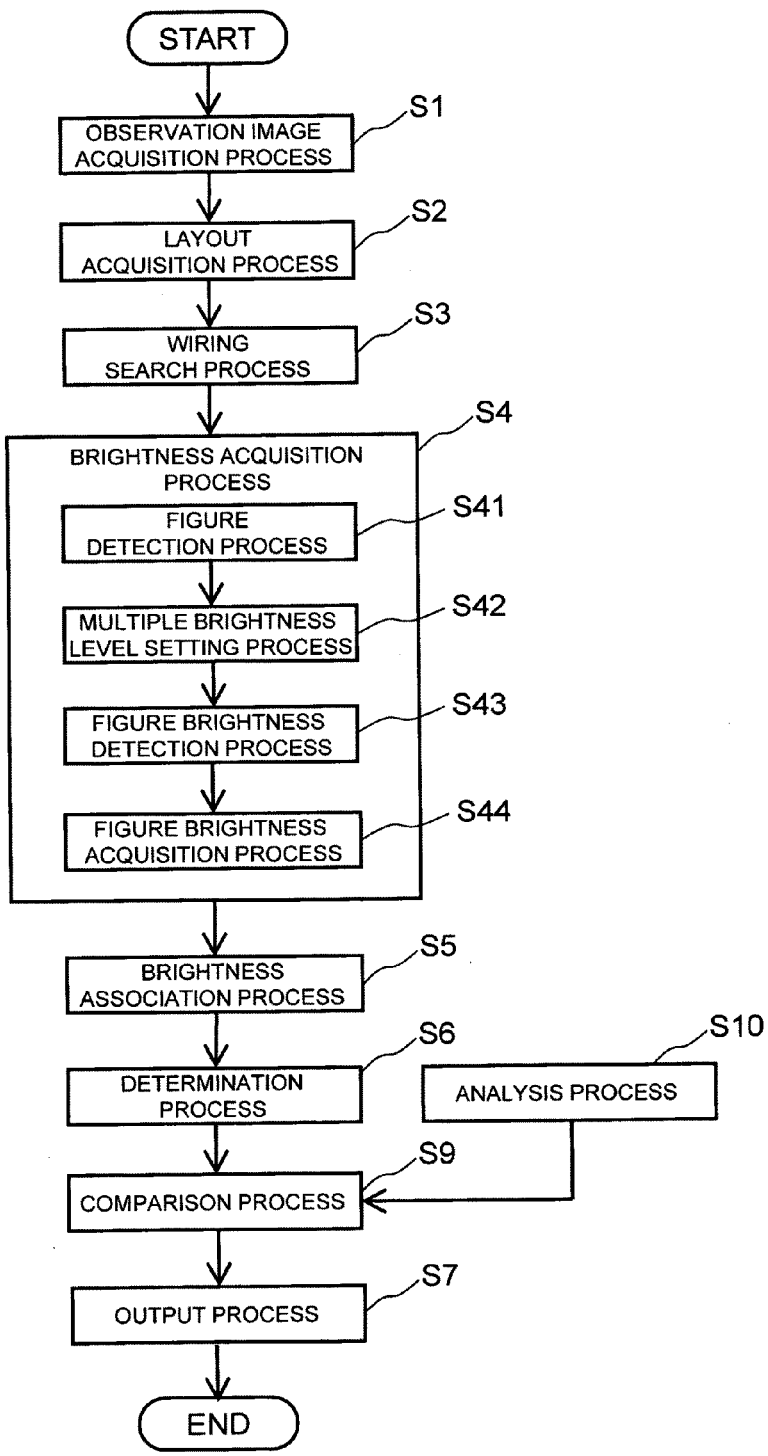
FIG. 16 is a flow chart of a semiconductor device failure analysis method according to another example.

According to example 7, as illustrated in a flow chart of FIG. 16, the failure analysis method includes an analysis process (step S10) and a comparison process (step S9). In the analysis process (step S10), another failure analysis method is used to identify defect positions of a defective semiconductor device. In the comparison process (step S9), wirings determined to be inconsistent in the determination process (step S6) and/or instances connected to end points of the wirings are compared with wirings and/or instances relating to the defect positions identified in the analysis process (step S10). Matching wirings and/or instances are determined to be defect positions of the semiconductor device. Further, in the output process (step S7), the defect positions determined in the comparison process are also outputted. Since other processes of example 7 are the same as those of example 1 illustrated in the detailed flow chart of FIG. 2, repetitive descriptions will be omitted.

EXAMPLE 8

According to example 8, in the output process (step S7), regarding wirings determined to be inconsistent in the determination process (step S6), the wirings are displayed in different colors on a layout. Different colors are used in the following manners: (A) each of the wirings is displayed in a different color, (B) each of the wiring end points on the observation image is displayed in a different color, (C) a wiring part of each of the wirings from the conductive layer on the observation image to the end point is displayed in a different color, and (D) each of the instances connected to the end points of the wirings is displayed in a different color. FIGS. 17A to 17C illustrate display examples according to example 8. FIG. 17A illustrates wirings W1 to W3 determined to be inconsistent, each displayed in a different color on a layout. Since each of the wirings is displayed in a different color, each connection end point can easily be identified. While FIG. 17B illustrates the wiring W2 determined to be inconsistent in different colors on a layout, a part of the wiring W2 from the conductive layer on the observation surface to the end point is displayed in blue, and the instance connected to the end point is displayed in red. Since the instance connected to the end point is displayed in a different color, the instance can easily be identified. FIG. 17C illustrates the wirings V5 and V7 determined to be inconsistent in the determination process. The wirings V5 and V7 of the conductive layer on the observation surface are displayed on a layout in different colors. As described above, regarding wirings determined to be inconsistent in the determination process (step S6), different colors are used in at least one of the following manners: (A) each of the wirings is displayed in a different color, (B) each of the wiring end points on the observation image is displayed in a different color, (C) a wiring part of each of the wirings from the conductive layer on the observation image to the end point is displayed in a different color, and (D) each of the instances connected to the end points of the wirings is displayed in a different color. In this way, defects can be analyzed easily.

EXAMPLE 9

According to example 9, in the output process (step S7), a layout image acquired from design data 11 is superposed on an observation image, and an obtained overlaid image is displayed, as illustrated in FIGS. 18A to 18C. Particularly, by effectively using colors, the layout image can be superposed on an observation image more effectively. For example, FIG. 18A is an example in which a layout image including wirings displayed in different colors depending on consistency/inconsistency determined in the determination process (step S6) is superposed on an observation image. Further, FIG. 18B is an example in which a layout image including a wiring determined to be inconsistent in the determination process (step S6) is superposed on an observation image. Furthermore, FIG. 18C is an example in which a layout image including wirings displayed in different colors depending on the end points of the wirings is superposed on an observation image.

EXAMPLE 10

Next, a semiconductor device failure analysis apparatus according to example 10 of the present invention will be described. FIG. 19 is a block diagram of a schematic configuration of a semiconductor device failure analysis apparatus 100 according to example 10. In FIG. 19, an analysis apparatus 20 irradiates the semiconductor device 50 (see FIGS. 3 and 5) having a conductive layer exposed and charged to a desired voltage with charged particles and outputs a voltage contrast image. An observation image acquisition unit 1M acquires the voltage contrast image from the analysis apparatus 20. The design data 11 is data used to design the semiconductor device 50. For example, the design data 11 includes layout figure data about each layer of the semiconductor device 50 and information about circuit connection points of the semiconductor device 50. A wiring search unit 3M receives the design data 11 from the outside and searches for end points connected to the exposed conductive layer on the observation image of the semiconductor device 50 acquired by the observation image acquisition unit 1M. While the analysis apparatus 20 may be included in the failure analysis apparatus 100, the analysis apparatus 20 is separated from the failure analysis apparatus 100 in this example. The description will be made based on the assumption that the failure analysis apparatus 100 acquires an observation image from the analysis apparatus 20 and analyzes the obtained image.

A determination unit 6M compares the voltage contrast image acquired by the observation image acquisition unit 1M with voltage contrasts of three levels or more set in advance, one of which is set for a wiring depending on a state of an end point of the wiring, so as to determine consistency/inconsistency. Based on the above configuration, the failure analysis apparatus 100 can execute the semiconductor device failure analysis method according to example 1. The wiring search unit 3M may carry out the layout acquisition process (step S2) in the detailed flow chart of FIG. 2, and the determination unit 6M may carry out the brightness acquisition process (step S4), the brightness association process (step S5), and the output process (step S7).

FIG. 20 is a detailed block diagram of an overall configuration of a semiconductor device failure analysis apparatus according to example 10. FIG. 20 includes units that are omitted in FIG. 19. In FIG. 20, a semiconductor device failure analysis apparatus 100A is largely formed by eight blocks; that is, an observation image acquisition unit 1, a layout acquisition unit 2, a wiring search unit 3, a brightness acquisition unit 4, a brightness association unit 5, a determination unit 6, an output unit 7, and a display unit 8. While the analysis apparatus 20 may or may not be included in the failure analysis apparatus 100A, the analysis apparatus 20 is included in the failure analysis apparatus 100A in FIG. 20.

The analysis apparatus 20 irradiates a semiconductor device having a conductive layer exposed and charged to a desired voltage with charged particles to obtain and output a voltage contrast observation image. The observation image acquisition unit 1 acquires the observation image from the analysis apparatus 20. The layout acquisition unit 2 acquires a layout pattern of the conductive layer on the observation image from the design data 11 about the semiconductor device 50 (see FIGS. 3 and 5).

The wiring search unit 3 searches for wiring end points connected to the layout pattern. Examples of the wiring end points searched for by the wiring search unit 3 include a transistor gate electrode, a transistor diffusion region, and a floating element.

The brightness acquisition unit 4 includes a figure detection unit 41, a multiple brightness level setting unit 42, a figure brightness detection unit 43, and a figure brightness acquisition unit 44. The brightness acquisition unit 4 acquires brightness levels of the observation image corresponding to the layout pattern searched for by the wiring search unit 3. The figure detection unit 41 extracts edges in the observation image to detect figurative elements of the image. The shapes of the detected figurative elements are not limited to rectangular and elliptical. The figure detection unit 41 may detect figurative elements of an arbitrary shape. The multiple brightness level setting unit 42 sets brightness thresholds. By using the brightness thresholds as references, the multiple brightness level setting unit 42 assigns each pixel of the observation image with a brightness level. While each pixel of the figurative elements detected in the figure detection unit 41 is provided with one of the brightness levels set in the multiple brightness level setting unit 42, the figure brightness detection unit 43 detects a majority brightness level in each figurative element and determines the majority brightness level to be the brightness level of the figurative element. The figure brightness acquisition unit 44 extracts the brightness levels detected by the figure brightness detection unit 43 from the figurative elements corresponding to the layout pattern, among the figurative elements detected by the figure detection unit 41.

By creating in advance a table indicating a correspondence relationship between multiple brightness levels and wiring end points, the brightness association unit 5 associates the brightness levels and wiring end points. The brightness association unit 5 may associate the multiple observation image brightness levels set by the multiple brightness level setting unit 42 with wiring end points.

The determination unit 6 determines whether brightness levels of the layout pattern acquired by the brightness acquisition unit 4 and the wiring end points that are connected to the layout pattern and that are acquired by the wiring search unit 3 are consistent with the correspondence relationship between the brightness levels and the wiring end points acquired by the brightness association unit 5. The output unit 7 outputs processing results of the determination unit 6. More specifically, if the determination unit 6 determines inconsistent wirings as a result of processing, the output unit 7 outputs names and coordinates of the wirings extending from the conductive layer on the observation image to end points of the wirings. Further, names and coordinates of instances connected to the end points of the wirings are outputted. Furthermore, types of the end points, the brightness levels obtained by the brightness acquisition unit 4, and the brightness levels that are obtained by the brightness association unit 5 and that correspond to the end point types are outputted. The display unit 8 displays processing results, an observation image, an observation image having multiple brightness levels, and a layout outputted from the output unit 7.

In addition, the display unit 8 displays the following information. The display unit 8 displays information so that an exposed conductive layer can be specified. Further, the display unit 8 displays information so that a table indicating a correspondence relationship between brightness levels and wiring end points can be created and edited. Furthermore, the display unit 8 displays figures detected by the figure detection unit 41. Furthermore, the display unit 8 displays information so that image processing parameters for detecting figurative elements can be changed. When the image processing parameters are changed, edges and detected figurative elements in an observation image are updated. The image processing parameters for detecting figurative elements are parameters (variable) set when an image feature extraction method such as Hough transform is used.

In addition, the display unit 8 displays information so that the brightness thresholds set by the multiple brightness level setting unit 42 can be changed. Also, the display unit 8 displays results obtained by the figure brightness detection unit 43, that is, the figurative elements each provided with one of the multiple brightness levels. When the brightness thresholds are changed, the multiple brightness levels are accordingly changed, and as a result, an observation image is updated. A computer may be caused to execute the above operations.

EXAMPLE 11

Based on a semiconductor device failure analysis apparatus according to example 11, the multiple brightness level setting unit 42 obtains a pixel number distribution for each brightness level to automatically calculate brightness thresholds, the number of brightness levels, and values of the individual brightness levels. Configurations other than the multiple brightness level setting unit 42 are the same as those of the failure analysis apparatus 100A according to example 10. The failure analysis apparatus according to example 11 can execute the failure analysis method according to example 2.

EXAMPLE 12

Based on a semiconductor device failure analysis apparatus according to example 12, the figure brightness acquisition unit 4 carries out a pattern matching image process on the figurative elements detected by the figure detection unit 41 and a layout pattern. In this way, the figure brightness acquisition unit 4 extracts figurative elements corresponding to the layout pattern and extracts brightness levels detected by the figure brightness detection unit 41. Further, the display unit 8 displays information so that image processing parameters for the pattern matching image process can be changed. Configurations other than the figure brightness acquisition unit 4 and the display unit 8 are the same as those of the failure analysis apparatus 100A according to example 10.

EXAMPLE 13

FIG. 21 is a detailed block diagram of a semiconductor device failure analysis apparatus 100B according to example 13. When compared with the failure analysis apparatus 100A of FIG. 20 according to example 10, the failure analysis apparatus 100B of FIG. 21 includes a defect data acquisition unit 13 and a comparison unit 10 receiving defect position data 14 from the defect data acquisition unit 13 and comparing the defect position data 14 with results supplied by the determination unit 6.

The defect data acquisition unit 13 calculates a circuit operation by using at least one programmed computer, design data, and test results, so as to acquire defect positions of a defective semiconductor device as wirings and/or instances. The comparison unit 10 compares wirings determined to be inconsistent by the determination unit 6 and/or instances connected to end points of the wirings with the wirings and/or the instances acquired by the defect data acquisition unit 13 and determines matching wirings and/or instances to be defect positions of the semiconductor device. The output unit 7 outputs names and coordinates of the defect positions determined by the comparison unit 10. The display unit 8 displays output data 12 including the names and coordinates of the defect positions outputted from the output unit 7. The defect data acquisition unit 13 may acquire defect positions of a defective semiconductor device from another failure analysis apparatus as wirings and/or instances. The failure analysis apparatus 100B according to example 13 can execute the semiconductor device failure analysis method according to example 6 or 7.

Further, as a variation of the failure analysis apparatus according to any one of examples 10 to 13, regarding wirings determined to be inconsistent by the determination unit 6, the display unit 8 may display the wirings in different colors on a layout. For example, the display unit 8 may use different colors in at least one of the following manners: (A) each of the wirings is displayed in a different color, (B) each of the wiring end points on the observation image is displayed in a different color, (C) a wiring part of each of the wirings from the conductive layer on the observation image to the end point is displayed in a different color, and (D) each of the instances connected to the end points of the wirings is displayed in a different color. The semiconductor device failure analysis apparatus according to the variation can execute the failure analysis method according to example 8.

Further, as a variation of the failure analysis apparatus according to any one of examples 10 to 13, the display unit 8 may superpose a layout image acquired by the layout acquisition unit 2 from the design data 11 on an observation image acquired by the observation image acquisition unit 1 and display an obtained overlaid image. Particularly, depending on consistency/inconsistency determined by the determination unit 6, the display unit 8 may display the wirings on the layout image in different colors and superpose the layout image on the observation image. Further, the display unit 8 may display wirings in different colors on the layout image, depending on the types of the wiring end points obtained by the search by the wiring search unit 3, superpose the layout image on an observation image, and display an obtained overlaid image. The semiconductor device failure analysis apparatus according to the variation can execute the failure analysis method according to example 9 as illustrated in FIGS. 18A to 18C.

EXAMPLE 14

According to example 14, a program causes a computer to execute the failure analysis method according to any one of the above examples 1 to 9 and to function as the failure analysis apparatus according to any one of the above examples 10 to 13 (including the variations).

Figure 22:
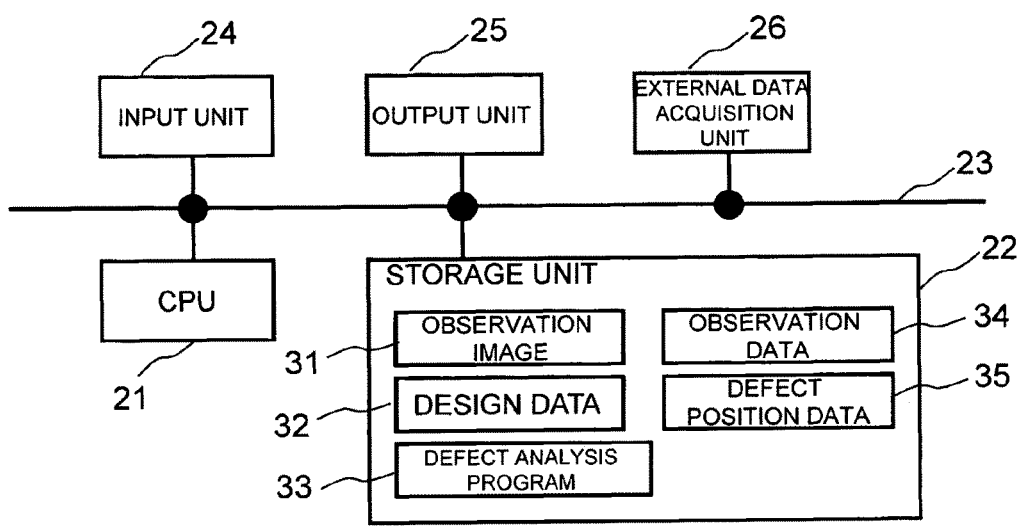
FIG. 22 is a block diagram of a semiconductor device failure analysis apparatus configured by a computer according to the present invention.

FIG. 22 is a block diagram of a semiconductor device failure analysis apparatus 100C configured by a computer. A general-purpose computer such as an engineering workstation (EWS) or a personal computer (PC) may be used as the computer according to example 14. The computer of FIG. 22 includes: a central processing unit (CPU) 21; an input unit 24 receiving instructions to execute the program; an output unit 25; a storage unit 22; and an external data acquisition unit 26 acquiring an observation image 31, observation data 34, design data 32, and defect position data 35 from the analysis apparatus 20. Other than a main storage unit such as a cache or a semiconductor memory, the storage unit 22 may include an auxiliary storage unit such as a magnetic storage medium or an optical storage medium, such as a hard disk, a compact disc (CD), or a digital versatile disc (DVD).

The storage unit 22 stores a failure analysis program 33 that causes the CPU 21 to execute the observation image acquisition process (step S1), the layout acquisition process (step S2), the wiring search process (step S3), the brightness acquisition process (step S4), the brightness association process (step S5), the determination process (step S6), the output process (step S7), the diagnosis process (step S8), and the comparison process (step S9) referred to in the description of the semiconductor device failure analysis method with FIGS. 2, 15, 16, and the like. If the CPU 21 is also caused to execute the analysis process (step S10) of FIG. 16, processing causing the CPU 21 to execute the analysis process (step S10) may be included in the failure analysis program 33. The observation image 31, the observation data 34, the design data 32, and the defect position data 35 acquired from the outside are also stored in the storage unit 22. The input unit 24, the CPU 21, the storage unit 22, the external data acquisition unit 26, and the output unit 25 are connected to each other via a bus line 23.

A computer in which the above semiconductor device failure analysis program 33 is installed functions as the semiconductor device failure analysis apparatus 100C including the observation image acquisition unit 1, the layout acquisition unit 2, the wiring search unit 3, the brightness acquisition unit 4, the brightness association unit 5, the determination unit 6, the output unit 7, the defect data acquisition unit 13, and the comparison unit 10. This computer may be a general engineering workstation or personal computer including: an output unit such as a display; an input unit such as a keyboard and a mouse; an auxiliary storage unit such as a DVD and a CD-ROM; and an external interface function for internet connection and the like. Further, the above semiconductor device failure analysis program 33 can be installed in the above computer through a storage medium such as a semiconductor memory, a magnetic storage medium, or an optical storage unit or through the Internet.

The present invention can be used to analyze defects of semiconductor devices. The present invention is not only applicable to the analysis of defects of semiconductor devices. By making modifications to design or manufacturing processes of semiconductor devices based on failure analysis results, the present invention can be used to improve quality of semiconductor devices. Further, based on failure analysis results, by making modifications to design or manufacturing processes, the yield can be improved, and manufacturing costs of semiconductor devices can be reduced.

In the present invention, there are various possible modes, which includes:

(Mode 1)

As set forth as the first aspect.

(Mode 2)

The semiconductor device failure analysis method according to mode 1, wherein, in the brightness association process, a different brightness level is assigned depending on whether the end point of a conductive layer is connected to a semiconductor region of a first conductivity type, to a semiconductor region of a conductivity type opposite to the first conductivity type, or to a transistor gate electrode.

(Mode 3)

The semiconductor device failure analysis method according to mode 1 or 2, wherein, in the multiple brightness level setting process, a pixel number distribution is obtained for each brightness level to automatically calculate brightness thresholds, the number of brightness levels, and values of the individual brightness levels.

(Mode 4)

The semiconductor device failure analysis method according to any one of modes 1 to 3, wherein, in the figure brightness acquisition process, a pattern matching image process is carried out on the figurative elements detected in the figure detection process and the layout pattern to extract the figurative elements corresponding to the layout pattern and brightness levels detected in the figure brightness detection process.

(Mode 5)

The semiconductor device failure analysis method according to any one of modes 1 to 4, wherein, in the brightness association process, multiple observation image brightness levels set in the multiple brightness level setting process and wiring end points are associated.

(Mode 6)

The semiconductor device failure analysis method according to any one of modes 1 to 5, wherein, in the observation image acquisition process, a voltage contrast observation image is acquired by irradiating a semiconductor wafer charged to a desired voltage with charged particles in a manufacturing process, and wherein, in the layout acquisition process, a layout pattern of the conductive layer on the observation image is acquired from design data about a semiconductor device formed on the semiconductor wafer.

(Mode 7)

The semiconductor device failure analysis method according to any one of modes 1 to 6, further comprising:

a diagnosis process of calculating a circuit operation by using at least one programmed computer, design data, and test results to acquire defect position(s) of a defective semiconductor device as wiring(s) and/or instance(s); and a comparison process of comparing wiring(s) determined to be inconsistent in the determination process and/or instance(s) connected to end points of the wiring(s) with the wiring(s) and/or the instance(s) acquired in the diagnosis process to determine matching wiring(s) and/or instance(s) to be defect position(s) of the semiconductor device, wherein, in the output process, the defect position(s) determined in the comparison process are also outputted.

(Mode 8)

The semiconductor device failure analysis method according to any one of modes 1 to 6, further comprising:

an analysis process of using another failure analysis method to identify defect position(s) of the semiconductor device; and a comparison process of comparing wiring(s) determined to be inconsistent in the determination process and/or instance(s) connected to end points of the wiring(s) with wiring(s) and/or instance(s) relating to the defect position(s) acquired in the analysis process to determine matching wiring(s) and/or instance(s) to be defect position(s) of the semiconductor device, wherein, in the output process, the defect position(s) determined in the comparison process are also outputted.

(Mode 9)

The semiconductor device failure analysis method according to any one of modes 1 to 8, wherein, regarding wiring(s) determined to be inconsistent in the determination process, in the output process, name(s) and coordinates of the wiring(s) from the conductive layer on the observation image to end points of the wiring(s), name(s) and coordinates of instance(s) connected to the end points, types of the end points, brightness levels acquired by the brightness acquisition process, and brightness levels that are acquired by the brightness association process and that correspond to the types of the end points are outputted.

(Mode 10)

The semiconductor device failure analysis method according to any one of modes 1 to 9, wherein, regarding wiring(s) determined to be inconsistent in the determination process, in the output process, different colors are used on a layout in at least one of the following manners: (A) each of the wiring(s) is displayed in a different color, (B) each of the wiring end points on the observation image is displayed in a different color, (C) a wiring part of each of the wiring(s) from the conductive layer on the observation image to the end point is displayed in a different color, and (D) each of the instance(s) connected to the end points of the wiring(s) is displayed in a different color.
(Mode 11)

The semiconductor device failure analysis method according to any one of modes 1 to 10, wherein, in the output process, a layout including wiring(s) displayed in different colors depending on consistency/inconsistency determined in the determination process is superposed on an observation image and an obtained overlaid image is displayed.
(Mode 12)

The semiconductor device failure analysis method according to any one of modes 1 to 10, wherein, in the output process, a layout including wiring(s) determined to be inconsistent in the determination process is superposed on an observation image and an obtained overlaid image is displayed.
(Mode 13)

The semiconductor device failure analysis method according to any one of modes 1 to 10, wherein, in the output process, a layout including wiring(s) displayed in different colors depending on the end points of the wiring(s) is superposed on an observation image and an obtained overlaid image is displayed.
(Mode 14)

The semiconductor device failure analysis method according to any one of modes 1 to 13, further comprising a process of polishing a main surface of the semiconductor device, exposing a surface of the conductive layer, charging the conductive layer, and irradiating the conductive layer with charged particles.
(Mode 15)

As set forth as the second aspect.
(Mode 16)

The semiconductor device failure analysis apparatus according to mode 15, wherein, regarding wiring(s) determined to be inconsistent in the determination unit, the output unit outputs: name(s) and coordinates of the wiring(s) from the conductive layer on the observation image to end points of the wiring(s); name(s) and coordinates of instance(s) connected to the end points; types of the end points; brightness levels acquired by the brightness acquisition unit; and brightness levels that are acquired by the brightness association unit and that correspond to the types of the end points, wherein the display unit displays the processing results, the observation image, the observation image having multilevel brightness levels, and the layout outputted by the output unit, so that an exposed conductive layer can be specified, a table indicating a correspondence relationship between brightness levels and wiring end points can be created or edited, and figures detected by the figure detection unit can be displayed, wherein the display unit displays information, so that image processing parameters for detecting figurative elements can be changed, wherein edges and detected figurative elements in an observation image are updated every time the image processing parameters are changed, wherein the display unit displays information, so that brightness thresholds set by the multiple brightness level setting unit can be changed, and wherein the display unit displays results obtained by the figure brightness detection unit, and every time the brightness thresholds are changed, since the multiple brightness levels are accordingly changed, an observation image is updated.
(Mode 17)

The semiconductor device failure analysis apparatus according to mode 15 or 16, wherein the multiple brightness level setting unit obtains a pixel number distribution for each brightness level to automatically calculate brightness thresholds, the number of brightness levels, and values of the individual brightness levels.
(Mode 18)

The semiconductor device failure analysis apparatus according to any one of modes 15 to 17, wherein the figure brightness acquisition unit carries out a pattern matching image process on the figurative elements detected by the figure detection unit and the layout pattern to extract the figurative elements corresponding to the layout pattern and brightness levels detected by the figure brightness detection unit, and wherein the display unit displays information, so that image processing parameters for the pattern matching image process can be changed.
(Mode 19)

The semiconductor device failure analysis apparatus according to any one of modes 15 to 18, wherein the brightness association unit associates multiple observation image brightness levels set by the multiple brightness level setting unit and wiring end points.
(Mode 20)

The semiconductor device failure analysis apparatus according to any one of modes 15 to 19, further comprising:

a defect data acquisition unit that calculates a circuit operation by using at least one programmed computer, design data and test results to acquire defect position(s) of a defective semiconductor device as wiring(s) and/or instance(s); and a comparison unit that compares wiring(s) determined to be inconsistent by the determination unit and/or instance(s) connected to end points of the wiring(s) with the wiring(s) and/or the instance(s) acquired by the defect data acquisition unit to determine matching wiring(s) and/or instance(s) to be defect position(s) of the semiconductor device, wherein the output unit outputs name(s) and coordinates of the defect position(s) determined by the comparison unit, and the display unit displays name(s) and coordinates of the defect position(s) outputted by the output unit.
(Mode 21)

The semiconductor device failure analysis apparatus according to any one of modes 15 to 20, further comprising:

a defect data acquisition unit that acquires defect position(s) of a defective semiconductor device acquired by another failure analysis apparatus as wiring(s) and/or instance(s); and a comparison unit that compares wiring(s) determined to be inconsistent by the determination unit and/or instance(s) connected to end points of the wiring(s) with the wiring(s) and/or the instance(s) relating to the defect position(s) acquired by the defect data acquisition unit to determine matching wiring(s) and/or instance(s) to be defect position(s) of the semiconductor device, wherein the output unit outputs the defect position(s) determined by the comparison unit, and the display unit displays name(s) and coordinates of the defect position(s) outputted by the output unit.
(Mode 22)

The semiconductor device failure analysis apparatus according to any one of modes 15 to 21, wherein, regarding wiring(s) determined to be inconsistent by the determination unit, the output unit uses different colors on a layout in at least one of the following manners: (A) each of the wiring(s) is displayed in a different color, (B) each of the wiring end points on the observation image is displayed in a different color, (C) a wiring part of each of the wiring(s) from the conductive layer on the observation image to the end point is displayed in a different color, and (D) each of the instance(s) connected to the end points of the wiring(s) is displayed in a different color.

(Mode 23)

The semiconductor device failure analysis apparatus according to any one of modes 15 to 21, wherein the display unit superposes a layout including wiring(s) displayed in different colors depending on consistency/inconsistency determined by the determination unit on an observation image and displays an obtained overlaid image.

(Mode 24)

The semiconductor device failure analysis apparatus according to any one of modes 15 to 21, wherein the display unit superposes a layout including wiring(s) determined to be inconsistent by the determination unit on an observation image and displays an obtained overlaid image.

(Mode 25)

The semiconductor device failure analysis apparatus according to any one of modes 15 to 21, wherein the display unit superposes a layout including wiring(s) displayed in different colors depending on the end points of the wiring(s) on an observation image and displays an obtained overlaid image.

(Mode 26)

The semiconductor device failure analysis apparatus according to any one of modes 15 to 25, further comprising an analysis apparatus that charges an exposed conductive layer of a semiconductor device to a desired voltage and irradiates the conductive layer with charged particles to acquire an observation image of the conductive layer having a voltage contrast.

(Mode 27)

A semiconductor device failure analysis method comprising:

acquiring a voltage contrast image by charging an exposed conductive layer of a semiconductor device and irradiating the exposed conductive layer with charged particles;

searching for wiring end points connected to the conductive layer based on design data; and comparing voltage contrasts of three levels or more set in advance, one of which is set for a wiring depending on a state of an end point of the wiring, with the voltage contrast image acquired in the observation image acquisition process to determine consistency/inconsistency.

(Mode 28)

A semiconductor device failure analysis apparatus comprising:

an observation image acquisition unit that acquires a voltage contrast image by charging an exposed conductive layer of a semiconductor device and irradiates the exposed conductive layer with charged particles;

a wiring search unit that searches for end points connected to the conductive layer based on design data; and a determination unit that compares voltage contrasts of three levels or more set in advance, one of which is set for a wiring depending on a state of an end point of the wiring, with the voltage contrast image acquired in the observation image acquisition process to determine consistency/inconsistency.

(Mode 29)

A program causing a computer to execute the semiconductor device failure analysis method according to any one of modes 1 to 13, 27.

(Mode 30)

A program causing a computer to function as the semiconductor device failure analysis apparatus according to any one of modes 15 to 26, 28.

(Mode 31)

A computer readable storage media storing the program of mode 29 or 30.

It should be noted that other objects, features and aspects of the present invention will become apparent in the entire disclosure and that modifications may be done without departing the gist and scope of the present invention as disclosed herein and claimed as appended herewith.

Also it should be noted that any combination or selection of the disclosed and/or claimed elements, matters and/or items may fall under the modifications aforementioned.

What is claimed is:

1. A semiconductor device failure analysis method comprising:

an observation image acquisition process of charging an exposed conductive layer of a semiconductor device and irradiating the conductive layer with charged particles to acquire an observation image of the conductive layer having a voltage contrast;

a layout acquisition process of acquiring a layout pattern of the conductive layer on the observation image from design data about the semiconductor device;

a wiring search process of searching for wiring end points connected to the layout pattern;

a brightness acquisition process of acquiring brightness levels of the observation image corresponding to the layout pattern searched for in the wiring search process;

a brightness association process of creating in advance a table indicating a correspondence relationship between three or more brightness levels of an observation image and wiring end points connected to a layout pattern corresponding to the observation image to associate the brightness levels and wiring end points;

a determination process of determining whether the observation image brightness levels acquired in the brightness acquisition process and the wiring end points searched for in the wiring search process are consistent with the table indicating a correspondence relationship between brightness levels and wiring end points associated in the brightness association process; and an output process of outputting results of the determination process, wherein the brightness acquisition process comprises:

a figure detection process of executing an image process to extract edges in the observation image and detect figurative elements of the image;

a multiple brightness level setting process of setting brightness thresholds and using the brightness thresholds as references to set three or more brightness levels and assign each pixel of the observation image with one of the brightness levels;

a figure brightness detection process of detecting the brightness levels set in the multiple brightness level setting process and assigned to the individual pixels of each of the figurative elements detected in the figure detection process and determining a majority brightness level of each of the figurative elements to be the brightness level of the figurative element; and a figure brightness acquisition process of extracting figurative elements corresponding to the layout pattern from the figurative elements detected in the figure detection process and extracting brightness levels detected in the figure brightness detection process.

2. The semiconductor device failure analysis method according to claim 1, wherein, in the brightness association process, a different brightness level is assigned depending on whether an end point of a conductive layer is connected to a semiconductor region of a first conductivity type, to a semiconductor region of a conductivity type opposite to the first conductivity type, or to a transistor gate electrode.

3. The semiconductor device failure analysis method according to claim 1, wherein, in the multiple brightness level setting process, a pixel number distribution is obtained for each brightness level to automatically calculate brightness thresholds, a number of brightness levels, and values of individual brightness levels.

4. The semiconductor device failure analysis method according to claim 1, wherein, in the figure brightness acquisition process, a pattern matching image process is carried out on the figurative elements detected in the figure detection process and the layout pattern to extract the figurative elements corresponding to the layout pattern and brightness levels detected in the figure brightness detection process.

5. The semiconductor device failure analysis method according to claim 1, wherein, in the brightness association process, multiple observation image brightness levels set in the multiple brightness level setting process and wiring end points are associated.

6. The semiconductor device failure analysis method according to claim 1,
wherein, in the observation image acquisition process, a voltage contrast observation image is acquired by irradiating a semiconductor wafer charged to a desired voltage with charged particles in a manufacturing process, and
wherein, in the layout acquisition process, a layout pattern of the conductive layer on the observation image is acquired from design data about a semiconductor device formed on the semiconductor wafer.

7. The semiconductor device failure analysis method according to claim 1, further comprising:
a diagnosis process of calculating a circuit operation by using at least one programmed computer, design data, and test results to acquire a defect position of a defective semiconductor device as a wiring or an instance or both; and
a comparison process of comparing wirings determined to be inconsistent in the determination process or instances connected to end points of the wirings with the wirings or the instances acquired in the diagnosis process to determine matching wirings or instances to be defect positions of the semiconductor device,
wherein, in the output process, the defect positions determined in the comparison process are also outputted.

8. The semiconductor device failure analysis method according to claim 1, further comprising:
an analysis process of using another failure analysis method to identify defect positions of the semiconductor device; and
a comparison process of comparing wirings determined to be inconsistent in the determination process or instances connected to end points of the wirings with wirings or instances relating to the defect positions acquired in the analysis process to determine matching wirings or instances to be the defect position of the semiconductor device,
wherein, in the output process, the defect positions determined in the comparison process are also outputted.

9. The semiconductor device failure analysis method according to claim 1, wherein, regarding wirings determined to be inconsistent in the determination process, in the output process, names and coordinates of the wirings from the conductive layer on the observation image to end points of the wirings, names and coordinates of instances connected to the end points, types of the end points, brightness levels acquired by the brightness acquisition process, and brightness levels that are acquired by the brightness association process and that correspond to the types of the end points are outputted.

10. The semiconductor device failure analysis method according to claim 1, wherein, regarding wirings determined to be inconsistent in the determination process, in the output process, different colors are used on a layout in at least one of the following manners: (A) each wiring is displayed in a different color, (B) each of the wiring end points on the observation image is displayed in a different color, (C) a wiring part of each wiring from the conductive layer on the observation image to the end point is displayed in a different color, and (D) each instance connected to the end points of the wiring is displayed in a different color.

11. The semiconductor device failure analysis method according to claim 1, wherein, in the output process, a layout including wirings displayed in different colors depending on consistency/inconsistency determined in the determination process is superposed on an observation image and an obtained overlaid image is displayed.

12. The semiconductor device failure analysis method according to claim 1, wherein, in the output process, a layout including wirings determined to be inconsistent in the determination process is superposed on an observation image and an obtained overlaid image is displayed.

13. The semiconductor device failure analysis method according to claim 1, wherein, in the output process, a layout including wirings displayed in different colors depending on the end points of the wirings is superposed on an observation image and an obtained overlaid image is displayed.

14. The semiconductor device failure analysis method according to claim 1, further comprising a process of polishing a main surface of the semiconductor device, exposing a surface of the conductive layer, charging the conductive layer, and irradiating the conductive layer with charged particles.

15. A non-transitory computer readable medium storing a program causing a computer to execute the semiconductor device failure analysis method according to claim 1.

16. A semiconductor device failure analysis apparatus comprising:
an observation image acquisition unit that charges an exposed conductive layer of a semiconductor device to a desired voltage and irradiates the conductive layer with charged particles to acquire an observation image of the conductive layer having a voltage contrast;
a layout acquisition unit that acquires a layout pattern of the conductive layer on the observation image from design data about the semiconductor device;
a wiring search unit that searches for end points connected to the conductive layer based on the layout pattern of the conductive layer acquired by the layout acquisition unit;
a brightness acquisition unit that acquires brightness levels of the observation image corresponding to the layout pattern searched for by the wiring search unit;
a brightness association unit that creates in advance a table indicating a correspondence relationship between three or more brightness levels of an observation image and wiring end points connected to a layout pattern corresponding to the observation image to associate the brightness levels and wiring end points;
a determination unit that determines whether the observation image brightness levels acquired by the brightness acquisition unit and the wiring end points searched for by the wiring search unit are consistent with the table indicating a correspondence relationship between brightness levels and wiring end points associated by the brightness association unit;

an output unit that outputs information identifying position(s) determined to be inconsistent as a result of processing by the determination unit; and a display unit that displays information outputted by the output unit, wherein the brightness acquisition unit comprises:

a figure detection unit that extracts edges in the observation image to detect figurative elements of the image;

a multiple brightness level setting unit that sets brightness thresholds and uses the brightness thresholds as references to set three or more brightness levels and assign each pixel of the observation image with one of the brightness levels;

a figure brightness detection unit that detects the brightness levels set by the multiple brightness level setting unit and assigned to the individual pixels of each of the figurative elements detected by the figure detection unit to determine a majority brightness level of each of the figurative elements to be the brightness level of the figurative element; and a figure brightness acquisition unit that extracts figurative elements corresponding to the layout pattern from the figurative elements detected by the figure detection unit and extracts brightness levels detected by the figure brightness detection unit.

17. The semiconductor device failure analysis apparatus according to claim 16, wherein, regarding wirings determined to be inconsistent in the determination unit, the output unit outputs: names and coordinates of the wirings from the conductive layer on the observation image to end points of the wirings; names and coordinates of instances connected to the end points; types of the end points; brightness levels acquired by the brightness acquisition unit; and brightness levels that are acquired by the brightness association unit and that correspond to the types of the end points, wherein the display unit displays the processing results, the observation image, the observation image having multilevel brightness levels, and the layout outputted by the output unit, so that an exposed conductive layer can be specified, a table indicating a correspondence relationship between brightness levels and wiring end points can be created or edited, and figures detected by the figure detection unit can be displayed, wherein the display unit displays information, so that image processing parameters for detecting figurative elements can be changed, wherein edges and detected figurative elements in an observation image are updated every time the image processing parameters are changed, wherein the display unit displays information, so that brightness thresholds set by the multiple brightness level setting unit can be changed, and wherein the display unit displays results obtained by the figure brightness detection unit, and every time the brightness thresholds are changed, since the multiple brightness levels are accordingly changed, an observation image is updated.

18. The semiconductor device failure analysis apparatus according to claim 16, wherein, regarding wirings determined to be inconsistent by the determination unit, the output unit uses different colors on a layout in at least one of the following manners: (A) each wiring is displayed in a different color, (B) each of the wiring end points on the observation image is displayed in a different color, (C) a wiring part of each wiring) from the conductive layer on the observation image to the end point is displayed in a different color, and (D) each instance connected to the end points of the wirings is displayed in a different color.

19. The semiconductor device failure analysis apparatus according to claim 16, wherein the display unit superposes a layout including wirings displayed in different colors depending on consistency/inconsistency determined by the determination unit on an observation image and displays an obtained overlaid image.

20. A non-transitory computer readable medium storing a program causing a computer to execute a semiconductor device failure analysis method, the method comprising:

an observation image acquisition process of charging an exposed conductive layer of a semiconductor device and irradiating the conductive layer with charged particles to acquire an observation image of the conductive layer having a voltage contrast;

a layout acquisition process of acquiring a layout pattern of the conductive layer on the observation image from design data about the semiconductor device;

a wiring search process of searching for wiring end points connected to the layout pattern;

a brightness acquisition process of acquiring brightness levels of the observation image corresponding to the layout pattern searched for in the wiring search process;

a brightness association process of creating in advance a table indicating a correspondence relationship between three or more brightness levels of an observation image and wiring end points connected to a layout pattern corresponding to the observation image to associate the brightness levels and wiring end points;

a determination process of determining whether the observation image brightness levels acquired in the brightness acquisition process and the wiring end points searched for in the wiring search process are consistent with the table indicating a correspondence relationship between brightness levels and wiring end points associated in the brightness association process; and an output process of outputting results of the determination process, wherein the brightness acquisition process comprises:

a figure detection process of executing an image process to extract edges in the observation image and detect figurative elements of the image;

a multiple brightness level setting process of setting brightness thresholds and using the brightness thresholds as references to set three or more brightness levels and assign each pixel of the observation image with one of the brightness levels;

a figure brightness detection process of detecting the brightness levels set in the multiple brightness level setting process and assigned to the individual pixels of each of the figurative elements detected in the figure detection process and determining a majority brightness level of each of the figurative elements to be the brightness level of the figurative element; and a figure brightness acquisition process of extracting figurative elements corresponding to the layout pattern from the figurative elements detected in the figure detection process and extracting brightness levels detected in the figure brightness detection process.

\* \* \* \* \*